United States Patent
Eva

(10) Patent No.: US 10,976,667 B2
(45) Date of Patent: Apr. 13, 2021

(54) OPTICAL MANIPULATOR, PROJECTION LENS AND PROJECTION EXPOSURE APPARATUS

(71) Applicant: Carl Zeiss SMT GmbH, Oberkochen (DE)

(72) Inventor: Eric Eva, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 377 days.

(21) Appl. No.: 15/395,460

(22) Filed: Dec. 30, 2016

(65) Prior Publication Data

US 2017/0108780 A1    Apr. 20, 2017

Related U.S. Application Data

(63) Continuation of application No. PCT/EP2015/064551, filed on Jun. 26, 2015.

(30) Foreign Application Priority Data

Jul. 1, 2014   (DE) .......................... 102014212710.6

(51) Int. Cl.
   *G02B 1/06* (2006.01)
   *G02B 26/08* (2006.01)
   (Continued)

(52) U.S. Cl.
   CPC ............. *G03F 7/7015* (2013.01); *G02B 3/12* (2013.01); *G02B 7/028* (2013.01); *G02B 13/16* (2013.01);
   (Continued)

(58) Field of Classification Search
   CPC . G02B 3/12; G02B 7/102; G02B 7/02; G02B 3/14; G02B 3/00; G02B 26/0841;
   (Continued)

(56) References Cited

U.S. PATENT DOCUMENTS

2003/0053156 A1 *  3/2003  Satoh ................. G02B 26/0841
                                                                 358/511
2005/0112380 A1    5/2005  Boek et al.
                            (Continued)

FOREIGN PATENT DOCUMENTS

DE    102007010906 A1    9/2008
DE    102007014587 A1    9/2008
                (Continued)

OTHER PUBLICATIONS

International Search Report and Written Opinion in counterpart International Application No. PCT/EP2015/064551, dated Jan. 15, 2016, 20 pages.

(Continued)

*Primary Examiner* — Dawayne Pinkney
(74) *Attorney, Agent, or Firm* — Edell, Shapiro & Finnan, LLC

(57) ABSTRACT

An optical manipulator (MAN) includes an optical element (OE), in particular composed of fused silica, and an actuating device (DR) that reversibly changes the surface form (SF) of the optical element (OE). The actuating device (DR) has a plurality of actuators (AK) that mechanically act on the optical element (OE) at a plurality of contact areas. The optical element (OE) at least at action regions in vicinities of the contact areas of the actuators (AK) is prestressed to an compressive stress of more than 1 MPa, preferably of more than 100 MPa, particularly preferably of more than 500 MPa. Also disclosed are a projection lens provided with at least one such optical manipulator (MAN), a projection exposure apparatus having such a projection lens, and a method for producing such an optical manipulator (MAN).

30 Claims, 5 Drawing Sheets

(51) Int. Cl.
| | |
|---|---|
| *G02B 15/14* | (2006.01) |
| *G02B 7/02* | (2006.01) |
| *G03F 7/20* | (2006.01) |
| *G02B 27/00* | (2006.01) |
| *G02B 3/12* | (2006.01) |
| *G02B 13/16* | (2006.01) |

(52) U.S. Cl.
CPC ..... *G02B 27/0031* (2013.01); *G02B 27/0068* (2013.01); *G03F 7/70266* (2013.01); *G03F 7/70308* (2013.01); *G03F 7/70958* (2013.01)

(58) Field of Classification Search
CPC .. G02B 26/105; G02B 6/2766; G02B 27/283; G02B 7/021; G02B 7/023; G02B 7/04; G02B 7/08; B82Y 20/00; G02F 1/31; G11B 7/0932; G11B 7/0935
USPC ........... 359/667, 694, 665, 642, 290–292, 359/223–225, 245, 198, 260–263, 298, 359/301–303, 317–318, 237, 242, 247, 359/254, 811–830
See application file for complete search history.

(56) References Cited

U.S. PATENT DOCUMENTS

| | | |
|---|---|---|
| 2007/0165202 A1 | 7/2007 | Koehler et al. |
| 2008/0239503 A1 | 10/2008 | Conradi et al. |
| 2009/0217767 A1* | 9/2009 | Scherschlicht .......... G01B 7/16 73/779 |
| 2010/0060973 A1 | 3/2010 | Olaya et al. |
| 2010/0085551 A1* | 4/2010 | Vermeulen .......... G03F 7/70716 355/71 |
| 2010/0167189 A1 | 7/2010 | Del Puerto |
| 2011/0019169 A1 | 1/2011 | Conradi et al. |
| 2014/0338748 A1 | 11/2014 | Matano et al. |
| 2015/0147538 A1 | 5/2015 | Ishimaru et al. |

FOREIGN PATENT DOCUMENTS

| | | |
|---|---|---|
| JP | 2013110396 A | 6/2013 |
| TW | 201404732 A | 2/2014 |
| WO | 2004019128 A2 | 3/2004 |
| WO | 2005026843 A2 | 3/2005 |
| WO | 2011062812 A2 | 5/2011 |
| WO | 2013061905 A1 | 5/2013 |

OTHER PUBLICATIONS

Office Action in corresponding German Application 102014212710.6, dated May 19, 2015, along with English Translation.
Lee, Maggie Y.M., "Glass Part 3: New Generation of Specialty Glass for LCDs and AMOLEDs", www.gasesmag.com, 6 pages.
Morton et al., "Behavior of fused silica materials for microlithography irradiated at 193 nm with low-fluence ArF radiation for tens of billions of pulses", SPIE Proceedings vol. 4000, Jul. 2000; abstract only.
Muhlig et al., "Accelerated life time testing of fused silica upon ArF laser irradiation", SPIE Proceedings Vo. 7132, 2008,9 pages; abstract only.
Shelby et al., "Radiation effects in hydrogen-impregnated vitreous silica", American Institute of Physics, 1979; abstract only.
TW Office Action with English Translation, TW Patent Application No. 104121075, dated Aug. 17, 2018, 14 pages.

* cited by examiner

OPTICAL MANIPULATOR, PROJECTION LENS AND PROJECTION EXPOSURE APPARATUS

CROSS-REFERENCE TO RELATED APPLICATIONS

This is a Continuation of International Application PCT/EP2015/064551, which has an international filing date of Jun. 26, 2015, and the disclosure of which is incorporated in its entirety into the present Continuation by reference. The following disclosure is also based on and claims the benefit of and priority under 35 U.S.C. § 119(a) to German Patent Application No. DE 10 2014 212 710.6, filed Jul. 1, 2014, which is also incorporated in its entirety into the present Continuation by reference.

FIELD OF THE INVENTION

The invention relates to an optical manipulator, comprising: an optical element, in particular composed of fused silica, and an actuating device for reversibly changing the surface form of the optical element, wherein the actuating device has a plurality of actuators for mechanically acting on the optical element at a plurality of contact areas, to a projection lens comprising at least one such optical manipulator, and to a projection exposure apparatus comprising such a projection lens. The invention also relates to a method for producing such an optical manipulator.

BACKGROUND

It is known to use optical manipulators for wavefront correction or for correcting imaging aberrations in projection lenses for microlithography. By way of example, US 2008/0239503 A1 describes a projection lens of a projection exposure apparatus for microlithography which has an optical manipulator for reducing non-rotationally symmetrical imaging aberrations. In one exemplary embodiment, the manipulator has a first optical element, for example a plane plate, and a second optical element, with an interspace being formed therebetween, a liquid being introduced into said interspace. At least one actuator is coupled to the first optical element in such a way that the operation of the actuator brings about a non-rotationally symmetrical deformation of the first optical element. At least two actuators can be mounted along the circumference of the first optical element, which introduce mechanical bending moments into the optical element in order to reversibly change the surface form thereof.

When bending moments are generated for changing the surface form of an optical element, both mechanical tensile and compressive stress are typically introduced into the optical element. In order to bring about a sufficiently large change in the surface form (bending) of the optical element for the purpose of correcting wavefront aberrations, the thickness of the optical element to be manipulated should not be chosen to be excessively large. If the intention is to carry out dynamic wavefront correction during exposure operation, frequently changing tensile and compressive stress occur at the optical element, i.e. the optical element is subjected to severe mechanical loading. The mechanical loading can have the effect that cracks or fractures form in the optical element before the envisaged lifetime of the optical element has been reached.

SUMMARY

It is an object of the invention to provide an optical manipulator having increased fracture resistance.

This object is achieved in accordance with a first aspect by an optical manipulator of the type mentioned in the introduction wherein the optical element at least at action regions in the vicinity of the contact areas of the actuators is prestressed to an compressive stress of more than 1 MPa, preferably of more than 100 MPa, particularly preferably of more than 500 MPa.

The optical element can be embodied in particular in a plate-shaped fashion. In the simplest case, the plate-shaped optical element can be a plane-parallel plate. Such a plate typically has a small thickness of e.g. less than 5 mm, in particular less than 3 mm, in order to bring about sufficient bending and thus sufficient deformation for wavefront manipulation. The optical element can also be a lens or a mirror, the mechanical actuators acting on the mirror substrate thereof. In this case, the optical element or the mirror substrate can likewise have a thickness of less than 5 mm and is embodied in a non-plane-parallel fashion, if appropriate. By way of example, such a lens or mirror can have a curvature in the region of its transmissive or reflective surface. Within the meaning of this application, a plate-shaped optical element is understood to be an optical element which can bend from the action of the actuators, with the result that it is possible to generate a sufficient reversible deformation of the surface form of the optical element for the correction of wavefront aberrations.

At the action regions of the optical element, which are formed at and/or adjacent to the contact areas of the actuators in a near-surface volume region or, if appropriate, in a volume region of the optical element that is further away from the surfaces, the mechanical tensile stress exerted on the material of the optical element by the actuators is maximal. The maximal tensile stress can occur at the surface of the optical element, in a near-surface volume region or, if appropriate, in a non-near-surface volume region.

If the actuators are embodied in the manner of levers that are fixedly connected to the optical element in order to introduce both a tensile stress and a compressive stress into the material of the optical element by tilting, tensile stresses that can be more than 1 MPa, if appropriate, more than 10 MPa, are introduced into the material of the optical element locally in the vicinity of the contact areas or of the foot points of the levers in the region of the surface of the optical element. In the case of actuators in the manner of levers which engage on the optical element and on which it is possible to generate a lateral force component with an arbitrary effective direction parallel to the surface of the optical element, the action regions can be embodied on average over time in a rotationally symmetrical fashion, i.e. in a circular or ring-shaped fashion, around and/or below the contact area. For a given deflection in an effective direction, the stresses are concentrated in a small circle segment. In practice, the actuators or the levers are acted on, i.e. pulled or pressed, often only in one principal direction, such that the action regions form two mutually opposite circle segments.

While the introduction of compressive stress into fused silica and other optical materials is largely non-critical, the tensile strength of fused silica for a static load is in the range of approximately 50 MPa to 60 MPa. These values can be increased by up to one order of magnitude by polishing free of depth damage. The following are known as methods for producing a polishing free of depth damage: grounding and polishing using graded grain (in each step removal of 1 to 2 times the diameter of the grain of the previous step); etching away to the maximum depth damage (typically double the grain size) and smoothing/polishing using graded grain.

Incipient etching using hydrofluoric acid is known as evidence of the depth damage. Damage that is microscopically indiscernible beforehand is etched to form craters in this case. If the optical element is embodied as a plane-parallel plate, a plane polishing free of depth damage is required. If grooves are introduced into the generally plane surface of the optical element, said grooves surrounding a contact area of a respective actuator in a ring-shaped manner, for example, the production of a groove surface free of depth damage is typically required. This can be produced by laser polishing, for example, as will be described in greater detail further below. It is assumed hereinafter that the required etching and/or polishing steps have already been carried out on the optical element, such that the latter has a surface free of depth damage.

As a result of the dynamic loading, fractures or cracks can occur at the material of the optical element, in particular at the action regions at which the tensile stress introduced is maximal. The prestress of the order of magnitude specified above exerts a compressive or compression stress on the optical element which is of the order of magnitude of the tensile stress or is ideally greater than the tensile stress, such that the occurrence of cracks of fractures can be counteracted. In the present application, the term compressive stress and tensile stress is understood to mean stresses which act perpendicularly to the thickness direction of the optical element or substantially parallel to the surface of the optical element.

The material of the optical element can be artificially produced fused silica, which is transparent to the used wavelengths relevant here, which lie in the UV wavelength range at less than approximately 250 nm. Particularly in the case of mirrors as optical elements, other materials such as titanium-doped fused silica, glass ceramic or ceramic are also possible. In the case of mirrors, these materials serve as a substrate to which a coating that is reflective for the respective used wavelength is applied. Such mirrors can also be designed for other wavelength ranges, for example for the EUV wavelength range, depending on the applied coating. Fused silica is often mentioned as material of the optical element hereinafter. In general, the relationships explained in association with fused silica correspondingly also apply to the other materials indicated above.

In one embodiment, the optical manipulator has a tensioning device enclosing the optical element and generate the compression stress by mechanical prestress of the optical element. In the case of a round optical element, the radial compression stress in this case can be introduced for example by a mounting ring. In the case of a rectangular optical element, linear compressive stress can be introduced along the two principal axes (longitudinal and transverse axes). A high compressive prestress is introduced in both cases, such that tensile stresses introduced by the actuators cannot have the effect that the optical element is locally subjected to tensile loading or—if a departure is made from the compressive loading region—locally lower tensile stresses arise than would be the case without the prestress. The tensioning device can enclose the optical element completely, i.e. continuously circumferentially. However, it is also possible for a tensioning element in the form of an e.g. rectangular or, if appropriate, ring-shaped frame to be embodied in a segmented fashion. In the case of a rectangular frame or a rectangular tensioning element, it is possible, for example, for the corners to be omitted and the plate to be clamped in at the longitudinal and transverse sides like between two vices.

Through mechanical bracing or shrink fitting of an e.g. metallic mount, compressive stress in the range of approximately 2 MPa can be obtained on an optical element composed of fused silica. With shrink fitting of tensioning elements in the form of e.g. rings composed of glass, glass ceramic or ceramic, even higher stresses can be realized. If the same material as for the optical element is used for the tensioning elements (that is to say, for example, a fused silica ring around fused silica), then the bracing is thermally stable. It is also possible, if appropriate, to perform "virtual" shrink fitting in this case. Overall a compressive stress is registered in this case by different cooling rates of outer and inner regions of the optical element via additional local heat buffers or heating elements. Such a procedure is known for setting a rotationally symmetrical stress birefringence in the case of a measurement of a blank or optical element in an axial direction.

The compressive prestress can compensate for tensile stresses of a similar order of magnitude that are introduced by actuators. If the optical element is embodied as a (thin) plane-parallel plate, maintaining the bracing over the lifetime of the optical element, which is generally a number of years, may be difficult to realize. If appropriate, the optical element can be embodied as a slight meniscus, such that changes in the prestress when the optical manipulator is arranged in a projection lens primarily lead to a focus term that can easily be compensated for. Generally, the generation of the projection lens by an external tensioning device is suitable primarily for comparatively thick optical elements, since this provides protection against bending perpendicularly to the radial stress.

In a further embodiment, the compressive stress is formed at at least one surface, in a near-surface volume region or in a non-near-surface volume region of the optical element. In the first case, the compressive stress is typically restricted to a near-surface volume region which is typically at a distance from the surface that is less than approximately 0.1 mm. If cracking in the outer approximately 100 μm can be effectively suppressed, problems with cracking in the region underneath generally no longer occur, since the formation of cracks often begins at the surface of the optical element. The compressive stress at the surface or in the near-surface volume region can be generated at one surface or at both surfaces of the optical element. Typically, the compressive stress is generated at least at that surface of the optical element which faces the actuators or the contact areas thereof. The compressive stress can also be formed in a non-near-surface volume region of the optical element. In this case, the near-surface volume region, which in this case generally has a thickness of not more than approximately 10 nm, forms a tensile layer which exerts a compressive stress on the underlying volume region. In this case, the action region having maximum tensile stress is typically likewise situated in the non-near-surface volume region.

In one embodiment, the compressive stress is formed both within and outside an optically used region of the optical element. The optically used region is that region of the optical element through which used radiation passes directionally in the case of a transmissive optical element. The optically used region in this case is typically surrounded by a ring-shaped region in which the actuators act on the optical element. In the case of a reflective optical element, for example a mirror, the optically used region forms that partial region of the surface at which radiation is reflected directionally. If the compressive stress is generated both within and outside the optically used region, it is of advantage if the compressive stress is distributed homogeneously along the surface, which can be achieved e.g. by applying a homogeneous coating (see below).

In an alternative embodiment, the compressive stress is formed only outside an optically used region of the optical element. As was described further above, in the case of a transmissive optical element, the actuators, to put it more precisely the contact areas of the actuators with the surface of the optical element and thus also the action regions having maximum tensile stress are typically formed outside the optically used region. In this case, but if appropriate also in the case of a reflective optical element, it can be advantageous if the compressive stress is generated only outside the optically used region. Particularly in the case of a transmissive optical element, the occurrence of stress birefringence within the optically used region can be prevented in this way.

In a further embodiment, the compressive stress (of the order of magnitude specified further above) is limited to the vicinities of the contact areas of the actuators at which the action regions are formed. The loading on the optically used region of the optical element can additionally be relieved in this way. As was described further above, a particularly high, maximum tensile stress occurs in the action regions of the actuators. Such an action region can be, for example, a surface region or a near-surface volume region of the optical element which is directly adjacent to the contact area of the actuator, i.e. touches the contact area of the actuator. However, such an action region can also surround the contact area of the actuator e.g. in a ring-shaped fashion or form both the surface region formed directly adjacent to the contact area of the actuator and a surface region surrounding said surface region, or a near-surface volume region.

The actuators are typically arranged at such a distance from one another that the action regions of two adjacent actuators do not overlap. In this way, it is possible to prevent the tensile stresses of adjacent actuators that occur during actuation from adding up at one and the same location in the optical element. In this case, the compressive stress can be introduced into the optical element for example in an island-shaped fashion, i.e. in a manner delimited to the vicinity of a respective contact area.

In one embodiment, the optical element comprises at least one coating which is vapour-deposited onto the surface and whose coefficient of thermal expansion is greater than the coefficient of thermal expansion of the material of the optical element (e.g. fused silica). Such a coating, which in particular can consist only of a single layer, typically has a thickness of not more than approximately 10 µm or, if appropriate, of less than 1 µm. If the coating extends into the optically used region of the optical element, the thickness of the coating should generally be significantly less than 1 µm in order to avoid an optical activity. If the transmission and the optical effect of the coating are not important, for example because the coating is formed only outside the optically used region, the coating should typically not exceed a thickness of approximately 10 µm. The thickness of the coating is also dependent, inter alia, on the magnitude of the desired stress and the extent to which the coefficient of thermal expansion of the coating differs from that of the substrate or of the optical element.

Generally, in the case of layers or in the case of coatings it is necessary to differentiate between tensile layers and compressive layers: tensile layers are themselves under tensile stress and strengthen the underlying material by virtue of the tensile layer compressing said material. The tensile layer itself is mechanically jeopardized and should therefore be as thin as possible, such that a tensile layer tends rather to be suitable for a local use for example at the action regions or around the actuator adhesive joints. Compressive layers constitute a part of the substrate or are connected thereto with very great adhesive strength. A compressive layer surrounds and thereby places itself under pressure and tends to bring about a tensile stress in the underlying substrate. The protective effect therefore occurs within the compressive layer, which should be chosen rather to be thick for this reason.

In the case described further above, the coating material chosen is a material having a greater coefficient of thermal expansion than the material of the optical element, e.g. fused silica. The at least one layer of the coating is applied to the substrate during the coating process e.g. by evaporation, sputtering or using an ion beam source at elevated temperature and is densified, if appropriate. The optical element, too, is typically heated during the application of the coating. After the cooling of the coating and the optical element, the coating has shrunk to a greater extent than the material of the optical element and therefore introduces a compressive stress into the optical element in the region of the surface, i.e. the coating acts as a tensile layer and thus in a manner similar to the tensioning device described further above, wherein the compressive stress in the case of the coating is delimited to a near-surface volume region of the optical element.

The optical element can be operated in transmission. In this case, the actuators typically engage outside the optically used region of the optical element (see above). If the coating in this case is intended to be applied to the optical element within the optically used region as well, the material of the coating should have a sufficient transmission for the used radiation at the used wavelength, which typically lies in the UV wavelength range in the present applications. The transmissive coating material can be a material that acts as an antireflection layer, for example a metal fluoride, e.g. $MgF_2$ or $LaF_3$, with which layer stresses of up to 400 MPa can be generated, which should be more than enough for the changing loads of a few MPa that occur in the present case. Metal oxides such as $Al_2O_3$ or $HfO_2$ are also sufficiently transparent in the UV wavelength range at 248 nm and, if appropriate, at 193 nm. If the coating is also applied within the optically used region, it is typically advantageous to coat the optical element on both sides homogeneously with a layer or coating that is strained to an identical magnitude in each case, in order that a light ray, upon passing through the optical element obliquely, in each case discerns the same stress components transversely with respect to the principal ray direction and no bending of the plate perpendicularly to the radial tensile stress occurs.

If an optical element in the form of a mirror is intended to be coated or the optically used region is masked during the process of coating a transmissive optical element, such that the coating is applied only outside the optically used region, the choice of coating material is significantly freer and metallic or ceramic layers can be used, provided that the latter have a sufficient adhesive strength and do not tend towards columnar growth. A coating surrounding the optically used region in a ring-shaped manner additionally has the advantage that the optically used region is largely free of stresses resulting from the tensile layer which might lead to disturbing stress birefringence. The loading on the optically used region can be relieved even further if the layer is formed only in the action regions at or around the contact areas of the actuators. If a respective contact area is surrounded by a ring groove, then it may suffice to coat only the surface of the ring groove and, if appropriate, in addition a directly adjoining planar surface region around the ring groove.

If the actuators engage on the optical element on both sides, the coating is typically formed on both surfaces of the optical element. Even if the actuators engage on the optical element only on one side, i.e. the action regions are formed only on one surface of the optical element, it may be advantageous to apply the layer or coating at both mutually opposite surfaces of the optical element in order to avoid deformation of the optical element under the tensile stress of a coating on one side.

Optical elements composed of fused silica are produced by mechanical processing of a blank composed of synthetic fused silica. The synthetic fused silica of the blank is generally produced by combustion of a silicon-containing, organic or inorganic precursor substance in $H_2$ and $O_2$, if appropriate with addition of a fuel gas such as natural gas, for instance. $SiO_2$ particles already form in the flame and are deposited on a target. In fused silica production, a distinction is made between the so-called direct process, in which a very hot flame is directed onto a hot target, such that the particles vitrify directly, and the so-called soot process, in which a porous body is deposited at lower temperatures and is sintered to form a solid glass body.

In a further embodiment, the optical element for generating the compressive stress in a near-surface volume region has a gradient of the coefficient of thermal expansion and/or a coefficient of thermal expansion that differs from the rest of the volume of the optical element, wherein the coefficient of thermal expansion in the near-surface volume region is typically greater than in the rest of the volume of the optical element. Differences in the coefficient of thermal expansion (CTE) of the fused silica can bring about a strain or compressive stress in the near-surface volume region, specifically if these differences are already present before the fused silica material is cooled to room temperature during its production. Such differences in the coefficient of thermal expansion can be achieved e.g. by the doping with impurity atoms, wherein the doping is carried out before the sintering or heat treatment process or, if appropriate, during the sintering or heat treatment process and before the subsequent cooling of the fused silica blank. A different coefficient of thermal expansion can also be produced during the production of the glass by changing the materials or compounds fed to the flame or else just the flame stochiometry (e.g. increased water content in the flame or changed titanium content in the case of titanium-doped material).

In a further embodiment, the optical element for generating the compressive stress has a layer which is connected to the surface of the optical element in particular by fusion or by thermal bonding for the purpose of generating the compressive stress and whose coefficient of thermal expansion is greater than the coefficient of thermal expansion of the material of the optical element. Analogously to the vapour-deposited layer described further above, a (thicker) tensile layer of a material having a higher coefficient of thermal expansion can be applied at elevated temperature to the optical element or at least to the action regions, i.e. to the regions at risk of fracture with maximum tensile strength. In this case, a for example plate-shaped body composed of a different material, e.g. a glass or (glass) ceramic having a higher coefficient of thermal expansion is e.g. bonded or fused onto the ground, lapped or polished surface of the optical element.

Silicate glasses generally have a significantly lower melting point than fused silica and already enter into a mechanically fixed connection below the glass transition temperature of fused silica (high-temperature bonding). With specific alkaline solutions, a mechanically fixed connection can already be produced at temperatures of a few 100° C. (low-temperature bonding) or with glass pastes ("frit bonding"). The layer having the higher coefficient of thermal expansion can also be produced, if appropriate, by a glass powder being fused locally by irradiation using a laser.

In all cases presented above, the layer when producing the connection is considerably thicker than in the case of a traditional coating. It is therefore generally necessary for the e.g. fused-on or bonded-on layer to be thinned by grinding or polishing after the production of the connection in order that the deformation of the optical element that is required for the wavefront correction is not impeded by an excessively large thickness. If a ring groove is formed on the optical element around the contact area of the actuator, then for example a layer of a different gas can be fused into the material of the optical element serving as a substrate and can then be removed through milling processing in order once again to produce a ring groove.

In a further embodiment, ions, in particular metal ions, metal atoms or other substances are incorporated for the purpose of generating the compressive stress at least in a near-surface volume region of the optical element. Toughened glass such as, for example, Gorilla® glass from Corning® is produced by an alkali metal silicate glass (here: sodium aluminosilicate glass) being introduced into the hot melt of a salt having larger ions (here: potassium). As a result, the sodium ion from the glass surface is dissolved and, conversely, potassium is incorporated into the glass. The potassium ions are larger and place the surface of the glass under compressive stress. In a similar manner to a prestressed concrete element, provision is made for ensuring that tensile stresses introduced externally do not have the effect that a departure is made locally from the pressure region. Furthermore, crack growth at notches is suppressed. A doped layer of a few 10 µm is sufficient for increasing the tensile strength of the glass by more than one order of magnitude, cf. the link "http://www.gasesmag.com/features/2013/May/Glass_May_2013.pdf". While the metals in the salt melt are present as ions, the latter are typically covalently bonded in the glass, e.g. are present in the form of metal atoms, the covalent bond having an ionic character to different degrees. By way of example, Na has a more strongly ionic character of the bond than e.g. Si. Pure fused silica contains no metals. It is known, however, that many tetravalent metals such as Ti, for instance, can be incorporated into the glass matrix instead of Si and that metals having a different valency such as Na and Cu can diffuse into the glass at sufficiently high temperatures and can be incorporated there.

In one development, the ions, the metal atoms or the other substances are incorporated into the near-surface volume region by ion exchange or by indiffusion from the gas phase. In this development, it is proposed to indiffuse ions into the glass in the ion exchange method or from the gas phase, i.e. without ion exchange, such that a compressive stress in the range of values specified above, i.e. from at least 1 MPa through the 1000 MPa or higher, if appropriate, is established in a near-surface volume region, which typically has a thickness of more 1 µm, if appropriate up to 1 mm or higher.

Since almost all metal ions in fused silica result in a high degree of absorption in the UV wavelength range, in the case of a transmissive optical element it is typically necessary to protect the optically used region by covering it with the same material as the material of the optical element or with a material in which the diffusion proceeds even more slowly than in the material of the optical element. Alternatively, it is possible to carry out precontouring of a blank before the doping by providing protective beads and removing the protective beads after the doping in order to protect the optically used region.

Aluminium is one of the few metals which do not result in an appreciable increase in absorption in fused silica at a wavelength of 193 nm. For lens element blanks up to a thickness of a plurality of cm, concentrations of aluminium in the ppm range appear to be acceptable (cf. US 2005/0112380 A1). It can be deduced from this that a doping in the per mille or even percent range may be acceptable for a near-surface volume region having a thickness of a few μm.

Therefore, if a transmissive optical element composed of fused silica is intended to be doped over the whole area, or if the masking is not effective enough, it is proposed to use aluminium or similar chemical elements for doping purposes. The masking can be maintained, even with limited efficacy, in order to enable even higher concentrations outside the optically used region. In the case of a mirror composed of fused silica, titanium-doped fused silica, glass ceramic or ceramic, measures for protecting the optically used region are generally not required, provided that the doping does not significantly influence the coefficient of thermal expansion of the substrate.

Analogously to the tensile layer described further above, for transmissive elements and mirrors, introduction of the ions on one side or on both sides and a restriction to the optically non-used region, the action region in or around a contact area of a respective actuator and, in particular, to a ring groove possibly present around the contact area of a respective actuator are possible.

In a further development, the ions are incorporated into the near-surface volume region by implantation using an ion beam. Non-metallic ions or metallic ions can be used for implantation. The implantation is typically carried out by indiffusion of the ions into the fused silica at room temperature, if appropriate at slightly elevated temperatures in order to foster the mobility of the implanted ions. It may be advantageous for a substrate already loaded with hydrogen to be cooled in order that it does not heat up to an excessively great extent under bombardment, which would result in outdiffusion of the hydrogen. This additionally has the advantage that the optical element serving as a substrate can remain at or near room temperature and that the penetration depth and the concentration profile can be controlled by way of the selection of the ions and the acceleration voltage of the ion source. Moreover, the use of a narrowly delimited ion beam enables the lateral doping profile to be controlled, such that masking of regions of the surface that are not provided for implantation can be completely dispensed with if appropriate.

The ion implantation typically results in a reduction of the density of the (fused silica) material in the near-surface volume region. The implanted ions exert a force on the glass matrix, which force results in swelling of the near-surface volume elements of the fused silica which are connected to the underlying material with shearing resistance. The near-surface volume region into which the ions are implanted thus forms a compressive layer and results in the desired prestress of the underlying fused silica. In a generalization of this method, the doping can be carried out with any type of particle beam and also with non-metallic materials.

In a further embodiment, the optical element is loaded with at least one gas, in particular with a noble gas and/or with nitrogen, for the purpose of generating the compressive stress. Gases are molecularly dissolved in fused silica; the gas atoms or molecules are incorporated to the interspaces of the glass matrix. The gas or gases is or are typically introduced into the optical element at high loading temperatures of e.g. more than 500° C. and generally elevated pressure relative to atmospheric pressure.

It is known that in the case of the indiffusion of hydrogen into fused silica, which is desired in UV applications, measurable stress birefringence also occurs besides changes in the refractive index, provided that high concentration gradients of more than $10^{18}$ molecules/cm$^3$ per mm occur. In principle, after the conventional hydrogen loading at a hydrogen partial pressure of 5% to 1000% that takes place in one or more steps over a number of weeks, a short loading phase with a partial pressure increased at least by the factor of 10 could be implemented. The hydrogen partial pressure in accordance with the above definition is dependent on the total pressure, i.e. a hydrogen partial pressure of, for example, 100% at 1 atm corresponds to a hydrogen partial pressure of 10% (i.e. 90% inert gas) at 10 atm. However, hydrogen also outdiffuses at room temperature and depletion zones having a thickness of a few 10 μm form after conventional antireflection coating (up to 200° C. or 300° C. and up to 2 hours) or storage at room temperature for a number of years. The increase in the mechanical strength as a result of the indiffusion of hydrogen thus lasts only for a limited time. In the individual case, such an increase in the mechanical strength can nevertheless have the effect that the total lifetime of the optical element is reached, since ageing under a changing load begins only if significant local tensile stresses are attained again after advanced outdiffusion of the hydrogen and decreasing global compressive stress.

It is more advantageous, however, to obtain the compressive stress by setting a concentration gradient using a gas which diffuses more slowly than molecular hydrogen at room temperature or with which significantly higher concentrations and thus compressive stress than with hydrogen are possible without other damage to the glass (hydrogen content of more than $10^{18}$ molecules/cm$^3$ generally results in a laser-induced change in the optical properties). Noble gases and nitrogen are particularly suitable for this purpose.

In the case of a gas which diffuses more slowly than hydrogen at room temperature, it is appropriate to use loading temperatures of more than 500° C. in order to shorten the process time. If, moreover, the loading of a surface layer having a thickness of a few micrometers at these temperatures lasts longer than a few minutes or hours, then the loading with the deforming gas should be performed before a colder loading with hydrogen, i.e. a loading at lower temperatures. A lateral control of the concentration and of the strain, for example for generating the compressive stress only in the action regions in the respective vicinities of the contact areas of the actuators, can be carried out by masking or precontouring of the optical element or of the blank from which the optical element is produced. Precontouring is generally more advantageous at elevated pressures and temperatures.

In one development, the content of the gas at least in the near-surface volume region is more than $1\times10^{16}$ molecules/cm$^3$, preferably more than $5\times10^{16}$ molecules/cm$^3$, in particular more than $1\times10^{18}$ molecules/cm$^3$. The concentration of the gas or of the gas molecules that is necessary for generating the desired compressive stress is dependent on the gas used. A high concentration is typically required in the case of lightweight molecules, e.g. Ar; a comparatively low concentration is typically required in the case of large molecules. The use of gases comprising large molecules is of advantage, moreover, since they diffuse more slowly than hydrogen and therefore do not outdiffuse from the optical element during the operation thereof. Such a high concentration of the gas in the near-surface volume region can be achieved through the indiffusion of the gas, in particular of a noble gas or nitrogen, at high pressure and (in order to accelerate the indiffusion) at high temperature. A high concentration of the indiffused gases brings about a high compressive stress in the near-surface volume region.

In one embodiment, the material of the optical element for generating the compressive stress in a near-surface volume region has a density deviating from the remaining volume of the optical element and/or a density gradient. If the near-surface volume region has a density that differs from the density in the rest of the volume of the optical element, the different density can bring about a compressive stress if the density in the near-surface volume region is less than in the rest of the volume of the optical element. In this case, the near-surface volume region swells and tends to bring about a tensile stress in the underlying (non-doped) rest of the volume that is connected to the near-surface volume region with shearing resistance.

Depending on the way in which the density difference in the near-surface volume region is produced, the density distribution there can be homogeneous or likewise have a gradient. The gradient can run for example substantially perpendicularly to the surface, wherein the largest density difference occurs at the surface and the density increasingly matches the density of the rest of the main body, the greater the distance from the surface. At all events, the density gradient should be chosen such that it results in the desired compressive stress at the surface.

In a further embodiment, the fused silica in a near-surface volume region has a density typically higher by at least 1% than in the rest of the volume of the optical element. The increase in the density of the optical element in the near-surface volume region can be produced by compaction brought about by UV light, electron beams, X-rays or generally high-energy radiation. A permanent compaction by up to 2% by volume or, if appropriate, 3% by volume can be achieved with electron radiation (e.g. at particle energies around approximately 100 eV) and X-ray radiation (e.g. at wavelengths of less than 10 nm). In this case, the penetration depth is extremely small, in the extreme case only a few nm depending on the energy of the radiation. In principle, it is advantageous for the process reliability to use a somewhat overly high dose per area element since, in this case, the saturation and thus the same compaction everywhere are achieved at every location.

The glass compacted in the near-surface volume region acts like a tensile layer and brings about a compression of the underlying glass. Unlike the vapour-deposited tensile layer or coating described further above, the compacted volume region has a much greater adhesive strength on the underlying glass and also no columnar structure having predetermined breaking locations. Consequently, greater stresses can be established as a result of the compaction and it is possible to avoid lifetime problems resulting from notch stresses or cracking in the vapour-deposited tensile layer or detachment of the vapour-deposited tensile layer. The transition between the near-surface volume region and the rest of the volume of the optical element perpendicular to the surface can be discontinuous or continuous. What is essential is that the density typically increased by at least 1% at the surface results in a strain in the near-surface volume region or at the transition to the underlying rest of the volume of the optical element which results in the desired compressive stress.

The densification or compaction of the material of the optical element is advantageous particularly in island-shaped surface regions around the contact areas of the actuators. This method has also proved to be advantageous for hardening the surface of a groove surrounding the contact area in a ring-shaped manner.

In a further development, the material of the optical element at least in the near-surface volume region has an OH content of more than 700 ppm (by weight) and a hydrogen content of more than $5 \times 10^{17}$ molecules/cm$^3$. Fused silicas, in particular those having a high OH content of more than 700 ppm and a high hydrogen content of typically more than $5 \times 10^{17}$ molecules/cm$^3$, upon irradiation with UV laser light having a low energy density (e.g. at a wavelength of 193 nm, 20 µJ/cm$^2$), tend towards swelling, so-called rarefaction, as was described for the first time (for 193 nm) in the article "Behaviour of fused silica materials for microlithography irradiated at 193 nm with low-fluence ArF radiation for tens of billions of pulses", R. G. Morton et al., Proc. SPIE Vol. 4000, July 2000, also cf. the article "Accelerated life time testing of fused silica upon ArF laser irradiation" by Ch. Mühlig et al., Proc. SPIE, Vol. 7132, December 2008, or US 2005/0112380 A1 cited further above. Glasses having such a high OH content are only rarely used for microlithography at 193 nm, but may be particularly well suited, if appropriate, to a thin plate-shaped optical element. In this case, hardening could be implemented by pre-irradiation at least in the action regions, i.e. in the regions of highest stress, and post-hardening is implemented by stray light during the operation of the optical element. Titanium-doped fused silica from Corning (ULE®) also has a composition suitable for rarefaction, such that mirrors composed of this material can likewise be hardened in the manner described above.

The occurrence of rarefaction under high-energy irradiation has been known for a longer time, cf. J. E. Shelby, "Radiation Effects in Hydrogen-impregnated Vitreous Silica," J. Appl. Phys. 50, 3702 (1979). In this case, the same sources as for electron beam compaction can be used as irradiation sources, wherein a somewhat thicker compressive layer is produced instead of a thin tensile layer through a suitable choice of the irradiation source and the glass parameters (OH content, $H_2$ content).

In a further embodiment, the compressive stress is generated by annealing of the optical element, preferably by annealing of a near-surface volume region of the optical element typically by using a laser beam (i.e. by laser annealing) or by fusion of the optical element in a near-surface volume region, wherein the fusion is typically carried out (locally) with use of a laser beam (so-called laser polishing). In addition or as an alternative to the use of a laser beam, it is also possible to use other high-energy radiation having a small penetration depth or electron beams for heating or fusion.

Besides the chemical hardening of glasses as described further above, physical hardening (annealing) is also known. Unlike in the hardening methods described above, annealing does not give rise to a change in the composition of the material of the optical element which would have to be detected e.g. by sputtering. Moreover, it is possible to produce very small volume regions in which a compression stress prevails and which are possibly no longer detectable stress-optically. However, raman spectroscopy, in particular confocal raman spectroscopy, can detect changes in the fictive temperature of the glass or other bonding parameters even with a spatial resolution of <1 μm, such that both the annealing restricted to the near-surface volume region and the local fusion at the optical element can be detected.

If a change in the form (figure) of the optical element during tempering is undesirable, then the glass material is brought to a temperature below the glass transition temperature $T_G$ and just above the lower relaxation temperature and is kept at this temperature for a number of hours or days. The glass is then quenched by gas being blown thereon, or by immersion into a liquid such as water, preferably ice water, or into liquid nitrogen. The quenching has the effect that tensile stresses initially form at the more rapidly cooling surfaces, said tensile stresses being reduced by plastic deformation. This deformation is frozen in and, after compensation of the temperature differences, brings about a compressive stress at the surface which significantly increases the strength of the glass thus obtained to withstand mechanical and thermal loads.

This procedure is possible in the case of fused silica too, although temperatures of around 1200° C. are necessary for the annealing. If a transmissive optical element is intended to be completely annealed, then indiffusion of sodium into near-surface layers and thus a transmission loss should be feared at such high temperatures. Furthermore, the requirements made of roughness and dimensional validity (figure) of the optical surface may possibly not be guaranteed, and so subsequent polishing and (possibly local) correction may become necessary. Moreover, in the case of quenching in liquid nitrogen it is difficult to restrict the compression zone to a few 10 μm, such that the glass plate is strained possibly macroscopically, i.e. not only in a near-surface volume region, and therefore possibly has optically significant stress birefringence.

Preferably, therefore, for transmissive fused silica elements, but also for mirrors composed of fused silica, titanium-doped fused silica, glass ceramic or ceramic, laser beams are used for annealing and hardening. For this purpose, laterally, typically locally, in the vicinity of a contact area of an actuator, the glass is heated by one or a plurality of laser pulses. The area to be hardened is heated piecewise or otherwise scanned given sufficient laser power.

In order that the laser radiation is absorbed by the material of the optical element, either an absorbent layer must be applied (temporarily) on the glass surface or a laser wavelength that is absorbed well in the glass material must be chosen. What is appropriate in this case for fused silica is infrared light at >3500 nm, in particular light from $CO_2$ lasers at 10.6 μm, and furthermore a wavelength in the range of the so-called water bands around 2700 nm, 2150 nm or 1400 nm, and UV radiation at less than 175 nm. In the case of short light pulses (ps and fs), it is also possible to use light in the near UV wavelength range (e.g. 355 nm or 266 nm). In this case, the incipient multi-photon and avalanche absorption provides for high absorption. For titanium-doped fused silica, the IR wavelengths are chosen similarly, but in the UV wavelength range UV light in the near UV wavelength range is already sufficient. In the case of a glass ceramic, all wavelengths can be used, including visible wavelengths depending on residual transmission.

In the case of absorption of the radiation at an absorbed layer or very high absorption in the glass and thus a very small optical penetration depth, the thermal penetration depth is determined by the duration of the laser pulse (individual laser pulse, duration of irradiation in the case of continuous-wave laser or duration of the burst in the case of high-repetition-rate laser). Particularly with ps and fs lasers, thermal penetration depths of a few μm to nm are possible.

The cooling of such thin layers is carried out within a few nanoseconds by emission from the surface (relevant primarily at very high temperatures owing to radiation law) and dissipation into the substrate (linearly in ΔT). If the power of an individual short pulse is insufficient, the beam diameter can be reduced and the area can be hardened by repetition laser in a scanning method. Since only the regions which are heated to >1000° C. are hardened, hardening arises despite macroscopic heating of the irradiated region by a few 10° C. or 100° C. only in the very thin near-surface volume region. In the absence of an absorption layer, the penetration depth can be controlled not only by the pulse duration but also by the choice of wavelength.

All laser hardening methods are also permitted to take place after hydrogen loading of the glass since temperatures of more than 300° C. to 500° C. exist only for very short periods of time usually for fractions of a second, and, moreover, such temperatures preferably occur only outside the optically used region of the optical element.

When the compressive stress is generated only outside the optically used region, it is also possible to set the laser parameters such that the glass surface is heated to a temperature above the glass transition temperature $T_G$ and thus melts locally. As a result, it is possible to cure depth damage, grounding and polishing defects or roughness from the grinding/etching which would reduce the strength of the surface as a result of crack growth or notch stresses. On account of the typical expansion curve of glasses (including fused silica), an even greater and possibly thin strain of the surface or of the near-surface volume region occurs as a result of the local melting. In the field of high-performance optics for laser fusion, the above-described method is known as laser polishing, laser annealing or laser repair and is used to repair mechanical polishing defects, but also damage as a result of previous operation at the laser used wavelength.

As in the case of the methods described further above, it is possible to use laser annealing or polishing on one or both sides, preferably in a ring-shaped manner outside the optically used region of the optical element or, if appropriate, only in islands in the action regions, i.e. at the contact areas or in the vicinity of the contact areas of the actuators or only within a ring-shaped groove formed around a respective contact area.

In a further embodiment, at least one contact area for connecting at least one actuator to the surface of the optical element is surrounded by a typically ring-shapedly (annularly) circumferential groove formed at the surface of the optical element. The groove, which is milled around the contact area and the depth of which is generally not more than 0.5 mm, preferably not more than 0.2 mm, ensures that the maximum tensile stresses in the optical element upon the actuation of the actuator which acts in the manner of a lever no longer occur in the surface region covered by the contact area but rather in the groove. This is advantageous particularly for the case where an adhesive is introduced between the contact area and the surface of the optical element, since the adhesive can be prevented from shearing away or being split off in this way. In this case, the groove is formed around that region of the surface of the optical element which is covered by the adhesive.

After the milling of the groove, it is possible to reduce processing stresses and depth damage by etching, although a greatly concave and rough surface generally remains in this case. Even without such depth damage, the small-scale modulation of the surface form has the effect that local stress spikes (notch stresses) can form in the groove. Moreover, the inner surface of the groove can be mechanically smoothed and polished with difficulty. Particularly preferably, therefore, the inner surface of the groove is locally smoothed and consolidated or hardened with the laser polishing described above. The hardening of the groove by laser polishing may possibly suffice to ensure the breaking strength of the optical element, such that the generation of the compressive stress as described further above can be dispensed with, if appropriate.

In a further embodiment, at least one actuator has an actuatable foot, at which a contact area for connecting the actuator to the surface of the optical element is formed. The foot, which is connected to the surface of the optical element, forms a lever, on whose side facing away from the contact area an actuating component, for example in the form of a piezo-element, can engage in order to apply a lateral force to the foot. Additionally or alternatively, the foot can also be moved in a direction perpendicular to the surface of the optical element in order to generate a compressive stress or a deflection of the optical element in the vicinity of the contact area.

The optical element is strained and bent by the adjustment of one foot or lever or generally a plurality of feet or levers, as a result of which high orders of the wavefront can be influenced in a targeted manner. The foot serving as a lever can be connected at the contact area to the generally planar surface of the optical element with the aid of a joining agent, for example with an adhesive. The circumferential groove described above can divert the stresses away from the adhesive. Alternatively, the feet or levers can also be screwed or soldered or welded on a metallization layer applied to the surface.

If the lever or the foot at which the contact area is formed is formed from aluminium, steel or a high-strength ceramic and if a sufficiently shearing-resistant connection to the glass of the optical element can be obtained, this results in a composite material having higher strength since most of the materials mentioned have a higher fatigue strength than the glass material of the optical element. This increased strength is present only below the foot, however, i.e. in the vicinity in which the contact area is connected to the surface of the optical element. If the foot has an approximately rectangular or steeply trapezium-shaped profile in side view, the maximum tensile stresses occur in the glass outside the vicinity covered by the contact area, however, at which the strength was not increased.

A further aspect of the invention relates to an optical manipulator of the type mentioned in the introduction which can be embodied in particular as described further above and wherein at least one actuator has an actuatable foot, at which a contact area for connecting the actuator to the surface of the optical element is formed, wherein the foot at least in the vicinity of the contact area has a contoured profile whose thickness decreases continuously, in particular exponentially, with increasing distance from the contact area, and/or wherein the material of the foot at least in the vicinity of the contact area has a mechanical strength which decreases continuously with increasing distance from a central axis of the foot.

If the diameter of the foot increases continuously towards the contact area, such that its thickness decreases continuously, preferably exponentially at least over a partial region, proceeding from the surface of the optical element, then the strength of the foot also decreases in the outer regions thereof. Upon the actuation of the foot acting as a lever, the foot can therefore increasingly deform in its outer regions. As a result, the stresses in the glass are distributed over a larger action region. As a result, the stresses decrease in terms of their amplitude and are still present for the most part in the composite region between the contact area and the surface of the optical element. In addition or as an alternative to the choice of the contoured profile, there is also the possibility of distributing the stresses by varying the strength of the foot material, e.g. by using a composition of the foot made from different alloying layers or by the provision of a doping gradient, such that an increased deformability is established in the outer regions of the foot, i.e. the regions furthest away from the centre axis which engage on the surface of the optical element. Using the contoured foot or the foot having varying strength, preferably the maximum tensile stresses occurring in the material of the optical element can be reduced to less than 1 MPa.

In addition or as an alternative to the use of a contoured foot or of a foot composed of a material having varying strength, it is also possible to apply an adhesive layer, which is fibre-reinforced, to the surface of the optical element. In this case, the fibre-reinforced adhesive layer typically extends beyond the diameter of the foot or beyond the contact area towards the outside. This measure, too, results in a spatial smearing of the stresses in the material of the optical element.

If the generally organic adhesive does not have sufficient shearing resistance or, if appropriate, adhesives are not permitted to be used for reasons of UV degradation or outgassing, a (for example contoured) foot can also be soldered or welded onto a metallization layer. In this case, too, smearing of the stresses in the optical element can be obtained by the choice of the diameter and thickness profile of the solder used.

In a further embodiment, the contact area of the foot having a contoured profile and/or a continuously decreasing mechanical strength is connected to the surface of the optical element by a joining agent and the compressive stress is a mechanical stress that is thermally induced when the foot is connected to the surface. If the foot having a contoured profile or having an outwardly decreasing mechanical strength and the glass substrate are brought to an elevated temperature for the curing of the adhesive or for soldering, the foot will generally shrink to a greater extent than the substrate during or after cooling, such that a compressive stress is introduced into the glass, which compressive stress can be more than 1 MPa. The strength of the glass is increased further by the introduced compressive stress which counteracts the tensile stress introduced into the material of the optical element during the actuation.

A further aspect relates to a projection lens for microlithography, comprising: at least one optical manipulator, embodied as described above, for the wavefront correction of the projection lens. In contrast to conventional optical manipulators, the wavefront correction can be implemented by the actuation of the optical element in real time during the exposure process by virtue of the optical element being strained or bent. In this way, individual orders of the wavefront, i.e. individual Zernike coefficients, can be influenced in a targeted manner. The projection lens can be embodied for used radiation in the UV wavelength range or for used radiation in the EUV wavelength range. In the latter case, the projection lens typically has no transmissive optical elements, and the optical manipulator is typically embodied as a EUV mirror.

In one development, the optical element of the optical manipulator is a plane-parallel plate introduced into the projection lens or a mirror element of the projection lens. The optical element of the optical manipulator can be a transmissive optical element, for example in the form of a plane-parallel, typically rectangular, plate. In this case, the optical element is introduced as an additional component into the beam path of the projection lens. In this case, the optical element can be arranged for example between the object plane with the mask to be imaged and the first lens element of the projection lens or elsewhere. In this case, the optical element embodied as a plane-parallel plate generally has a small thickness of approximately 2 mm to 3 mm. In this case, the actuators typically engage on the plane plate with their actuatable feet outside the optically used region.

It is possible to arrange the optical element elsewhere in the beam path of the projection lens. Alternatively or additionally, a mirror element which is already present anyway e.g. in a catadioptric projection lens can also serve as a wavefront manipulator. In this case, the actuators act on the mirror substrate of the mirror element. The mirror element can be arranged for example in a projection lens for the UV wavelength range or in a projection lens for EUV lithography.

A further aspect relates to a projection exposure apparatus for microlithography, comprising a projection lens embodied as described above. Such a projection exposure apparatus is typically provided for scanning operation, i.e. the object field, in which the structure to be imaged is arranged, is scanned during the exposure process. The optical manipulator is intended to be used for wavefront manipulation or for correction of image aberrations in real time during the scanning process, thus resulting in a high number of cycles of the order of magnitude of $10^9$ or more over the lifetime of the optical element of the optical manipulator. If, during the scanning exposure, the image aberrations change depending on the region currently exposed and are intended to be directly corrected (feed forward or closed loop), if appropriate an individual actuator must in each case sweep over a significant part of its actuation range, which, within the meaning of this application, is designated as a cycle, i.e. a cycle corresponds to an exposure process. The number of cycles over the lifetime of the optical element results from the wafer per hour (in the range of 100-300 wph "wafer per hour") and the exposures per wafer (in the range of hundreds of exposures).

In one development, the optical manipulator is designed for wavefront correction during an exposure process, wherein the optical element of the optical manipulator has a lifetime of at least 1 billion exposure processes (or cycles, see above). In the case of the loading of the optical element that is required for correcting wavefront aberrations, without the implementation of the measures described further above there is the fear that, with the use of the desired correction range for wavefront correction, the required lifetime of the optical element will not be achieved, such that cracks or fractures in the fused silica material of the optical element will already occur before the envisaged number of cycles has been completed. By virtue of the measures described above, the lifetime of the optical element can be increased or, for a predefined lifetime, it is not necessary to reduce the wavefront correction range that can be achieved with the optical manipulator.

A further aspect of the invention relates to a method for producing an optical manipulator as described above, comprising: generating the compressive stress at least at the action regions of the actuators by introducing a mechanical stress into a near-surface volume region, which mechanical stress can be thermally induced in particular during production, or generating the compressive stress at least at the action regions of the actuators in a non-near-surface volume region by compacting a near-surface volume region of the optical element. As was described further above, it is possible to generate a compressive stress at the surface of the optical element by said optical element being subjected to a thermal shock in the region of the surface, which thermal shock introduced a mechanical stress into the near-surface volume region of the optical element. The thermal shock can be generated by laser annealing, for example. The thermally induced mechanical stress can also be introduced by the local melting of the surface through a laser beam or electron beam. In order to increase the mechanical stress introduced, the optical element can be rapidly cooled after heating, for example by said optical element being cooled using liquid nitrogen. The thermally induced stress can, if appropriate, also be generated without prior heating through rapid cooling of the optical element, for example by the optical element being cooled using liquid nitrogen at the optical surface or in the volume region adjacent to the surface.

Alternatively, it is possible to implement a compaction of a near-surface volume region of the optical element by bombarding the surface of the optical element with particles, in particular with electrons, or by the action of radiation, in particular of x-ray radiation, on the surface of the optical element. The compaction can also be carried out in a different way, if appropriate. As a result of the compaction, the near-surface volume region exerts a compressive stress on the underlying non-near-surface volume region.

In one variant of the method, the compressive stress is generated at at least one groove formed at the surface of the optical element and surrounding a contact area of an actuator. As was described further above, the groove takes up the maximum stresses in the optical element. Therefore, it is advantageous to generate the compressive stress in the region of the groove. In this case, the compressive stress can likewise be generated in a near-surface or non-near-surface volume region of the optical element.

Further features and advantages of the invention are evident from the following description of exemplary embodiments of the invention, with reference to the figures of the drawing, which show details essential to the invention, and from the claims. The individual features can be realized in each case individually by themselves or as a plurality in arbitrary combination in a variant of the invention.

BRIEF DESCRIPTION OF THE DRAWINGS

Exemplary embodiments are illustrated in the schematic drawing and are explained in the following description. In the figures.

DETAILED DESCRIPTION

In the following description of the drawings, identical reference signs are used for identical or functionally identical components.

Figure 1:
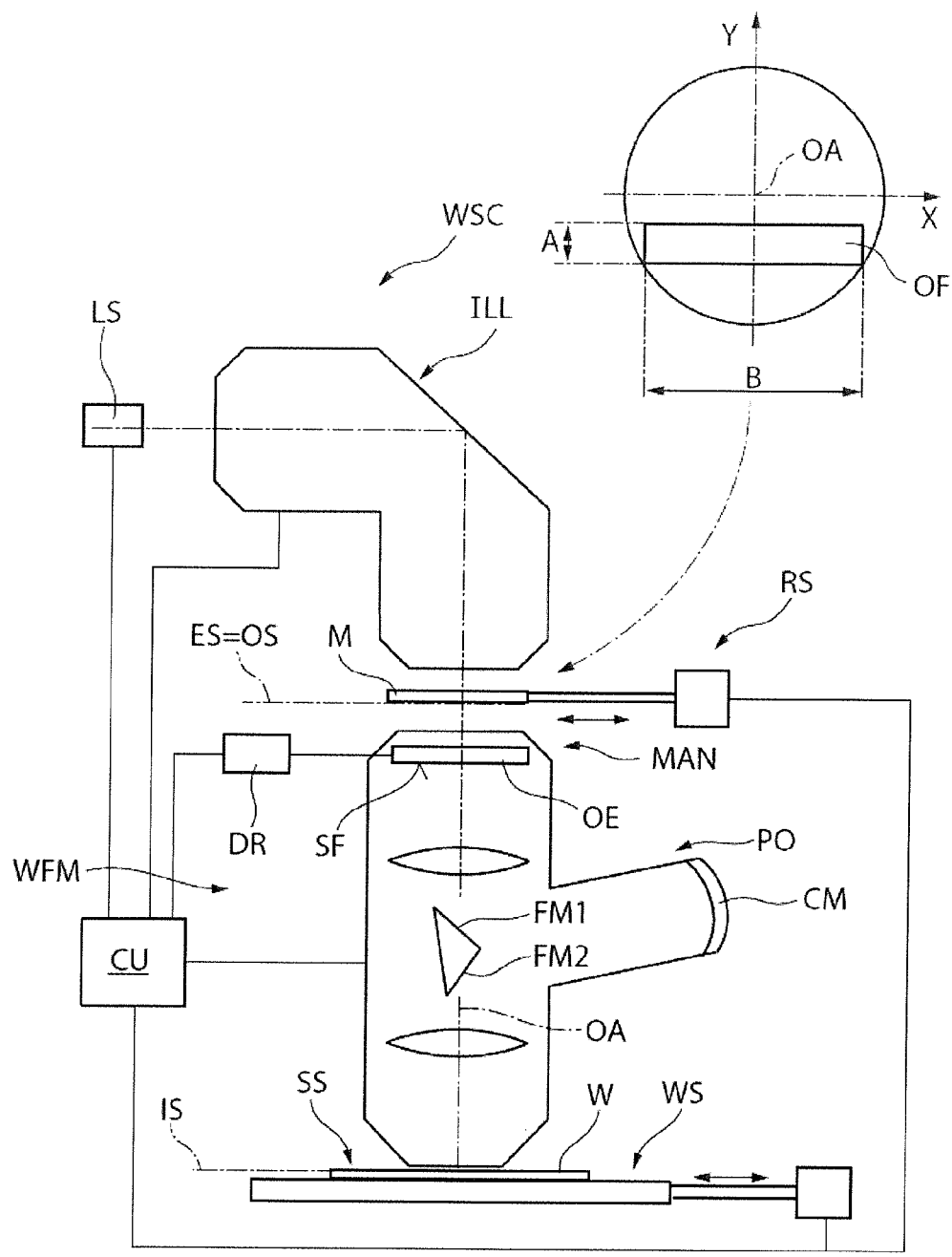
FIG. 1 shows a schematic illustration of one example of a projection exposure apparatus for microlithography.
Figure 1:
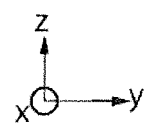

FIG. 1 shows one example of a projection exposure apparatus WSC for microlithography, which can be used in the production of semiconductor components and other finely structured components and operates with light or electromagnetic radiation from the deep ultraviolet (DUV) range for obtaining resolutions down to fractions of micrometers. An ArF excimer laser having a used wavelength $\lambda$ of approximately 193 nm serves as primary radiation source or light source LS. Other UV laser light sources, for example $F_2$ lasers having an operating wavelength of 157 nm or ArF excimer lasers having an operating wavelength of 248 nm, are likewise possible.

An illumination system ILL disposed downstream of the light source LS generates in its exit surface ES a large, sharply delimited illumination field that is adapted to the telecentricity requirements of the projection lens PO arranged behind that in the light path. The illumination system ILL has devices for setting different illumination modes (illumination settings) and can be switched for example between conventional on-axis illumination with a different degree of coherence $\sigma$ and off-axis illumination. The off-axis illumination modes comprise for example an annular illumination or a dipole illumination or a quadrupole illumination or some other multipolar illumination. The construction of suitable illumination systems is known per se and is therefore not explained in greater detail here. The patent application US 2007/0165202 A1 (corresponding to WO 2005/026843 A2) discloses examples of illumination systems which can be used in the context of various embodiments.

Those optical components which receive the light from the laser LS and shape from the light illumination radiation that is directed to the reticle M belong to the illumination system ILL of the projection exposure apparatus WSC.

A device RS for holding and manipulating the mask M (reticle) is arranged behind the illumination system such that the pattern arranged at the reticle lies in the object plane OS of the projection lens PO, which coincides with the exit plane ES of the illumination system and is also designated here as reticle plane OS. The mask is movable in this plane for scanner operation in a scanning direction (y-direction) perpendicular to the optical axis OA (z-direction) with the aid of a scan drive.

The projection lens PO follows behind the reticle plane OS, which projection lens acts as a reducing lens and images an image of the pattern arranged at the mask M with a reduced scale, for example with the scale of 1:4 ($|\beta|$=0.25) or 1:5 ($|\beta|$=0.20), onto a substrate W covered with a photoresist layer, the light-sensitive substrate surface SS of which substrate lies in the region of the image plane IS of the projection lens PO.

The substrate to be exposed, which is a semiconductor wafer W in the case of the example, is held by a device WS comprising a scanner drive in order to move the wafer synchronously with the reticle M perpendicular to the optical axis OA in a scanning direction (y-direction). The device WS, also designated as "wafer stage", and the device RS, also designated as "reticle stage", are parts of a scanner device controlled by a scan control device, which is integrated into the central control device CU of the projection exposure apparatus in this embodiment.

The illumination field generated by the illumination system ILL defines the effective object field OF used during the projection exposure. In the case of the example, this field is rectangular and has a height A measured parallel to the scanning direction (y-direction) and a width B>A measured perpendicular thereto (in the x-direction). The aspect ratio AR=B/A is generally between 2 and 10, in particular between 3 and 6. The effective object field is at a distance in the y-direction alongside the optical axis (off-axis field). The effective image field, optically conjugate to the effective object field, in the image surface IS has the same shape and the same aspect ratio between height B* and width A* as the effective object field, but the absolute field size is reduced by the imaging scale $\beta$ of the projection lens, i.e. A*=|B|A and B*=|B|B.

If the projection lens is designed and operated as an immersion lens, then during the operation of the projection lens radiation passes through a thin layer of an immersion liquid situated between the exit surface of the projection lens and the image plane IS. During immersion operation, image-side numerical apertures NA>1 are possible. A configuration as a dry lens is also possible; in this case, the image-side numerical aperture is restricted to values NA<1. Under these conditions, which are typical for high-resolution projection lenses, projection radiation with a relatively large numerical aperture, e.g. with values of greater than 0.15 or greater than 0.2 or greater than 0.3, is present in the region of some or all field planes (object plane, image plane, possibly one or a plurality of intermediate image planes) of the projection lens.

The projection lens PO shown in FIG. 1 is a catadioptric projection lens having a first, purely refractive lens part, a second, catadioptric lens part comprising a concave mirror CM, and a third, purely refractive lens part. The second lens part has a deflection device, which is embodied in the manner of a prism and which has a first plane deflection mirror FM1 for reflecting the projection radiation coming from the object plane OS to the concave mirror CM, and a second deflection mirror FM2, which is aligned at a right angle with respect to the first deflection mirror FM1 and which deflects the projection radiation reflected by the concave mirror CM in the direction of the image plane IS. Immersion lenses having a comparable basic construction are disclosed e.g. in the International Patent Application WO 2004/019128 A2. During immersion operation, image-side numerical apertures NA>1 are possible. A configuration as a dry lens is also possible; in this case, the image-side numerical aperture is restricted to values NA<1.

The projection lens or the projection exposure apparatus is equipped with an optical wavefront manipulation system WFM, which is configured for dynamically altering the wavefront of the projection radiation propagating from the object plane OS to the image plane IS in the sense that the optical effect of the wavefront manipulation system WFM can be set variably by using control signals. The wavefront manipulation system WFM in the exemplary embodiment has an optical manipulator MAN having an optical element OE, which is arranged in direct proximity to the object plane OS of the projection lens PO in the projection beam path and the surface form SF of which can be reversibly changed with the aid of an actuating device DR.

Figure 2A:
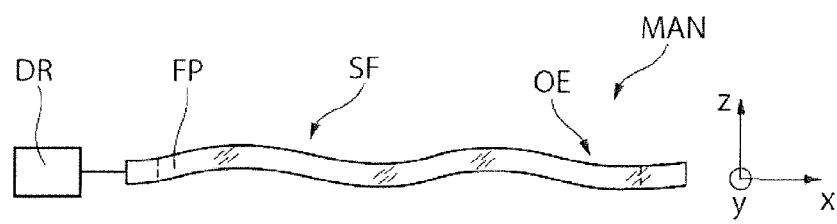
FIGS. 2A and 2B show schematic illustrations of one exemplary embodiment of an optical manipulator comprising a plate-shaped optical element and an actuating device in a side view and in a plan view.

For the purpose of further explanation, FIG. 2A shows a schematic longitudinal section through the optical manipulator MAN in an x-z-plane. The optical manipulator MAN has a plate-shaped optical element OE composed of a material transparent to the projection radiation, for example composed of synthetic fused silica. In the example shown, the optical element OE is embodied as a plane plate and has a thickness of approximately 2 mm and 3 mm. The surface form SF of the optical element OE, which is plane without the action of the actuating device, is changed by the action of the actuating device DR into the wavy surface form SF shown in FIG. 2A. In order to generate the wavy surface form SF, the actuator device DR comprises a plurality of actuators AK that are drivable independently of one another and are illustrated in a simplified manner in the form of circles in FIG. 2B.

Figure 2B:
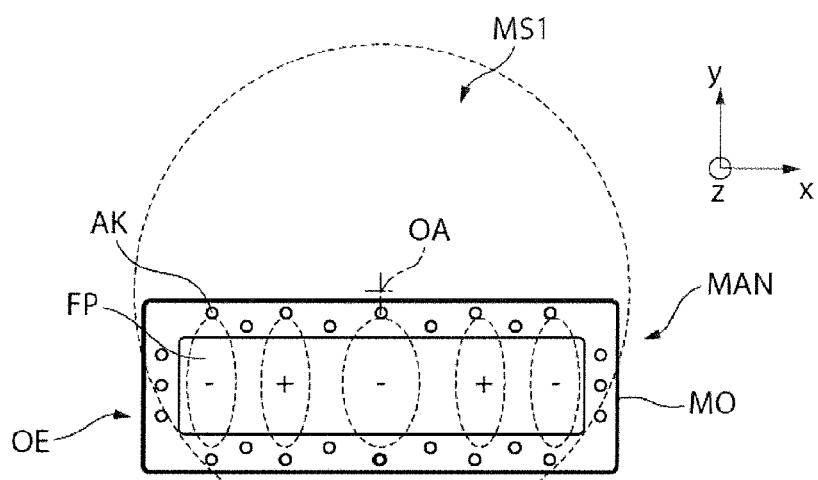

The actuators AK engage on the optical element OE outside an optically used region FP shown in FIG. 2B, the outer boundary of said optically used region being represented by a dashed line in FIG. 2A. The optically used region FP is illuminated by the rays coming from the effective object field OF. The optically used region FP is also designated as "footprint". Since the OE is arranged in proximity to the object field OF, the optical region FP used by the projection radiation substantially has the rectangular form of the illuminated object field OF, with the corner regions being rounded off somewhat.

The actuators AK are arranged outside the optically used region FP in order to prevent the projection radiation from being scattered or reflected at the actuators AK. The actuators AK engage on the plate-shaped optical element OE in such a way that the latter can be bent and the surface form SF can be brought into a wavy form in a defined manner. In this case, both the "amplitude" of the waves measured parallel to the z-direction, i.e. the deflection of the optical element OE in the z-direction and the distance between adjacent wave crests measured in the x-direction, i.e. the wavelength or period of the wave pattern, can be set to different values. In the case of the example, a sinusoidal profile is set in the x-direction.

FIG. 2B schematically shows that the surface form of the optical element OE in this direction has a plurality of local maxima (represented by wave crests in FIG. 2A and by "+" signs in FIG. 2B) and a plurality of intervening local minima (represented by wave troughs in FIG. 2A and "−" in FIG. 2B). The arrangement of the actuators AK shown in FIG. 2B is merely by way of example and the actuators AK can also be arranged in a different way around the optically used region FP in order to bend the optical element OE in the desired manner.

For the purpose of acting on the optical element OE, the actuators AK each have a foot F, which is illustrated in FIGS. 3A-3D. At its lower end, the foot F has a contact area K that connects to a first surface O1 of the optical element OE facing the foot F. An actuating element of the actuator AK, which can be embodied for example as a piezo-element, engages on the foot F at the end thereof facing away from the surface O1 of the optical element OE. As can be discerned in FIGS. 3A-3D, the foot F acts as a lever since the force exerted on the foot F in an upper partial region of the foot F has a force component in a lateral direction.

Figure 3A:
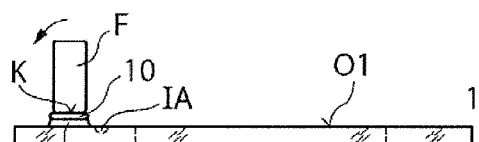
FIG. 3A-3D show schematic illustrations of a plurality of possibilities for fixing a foot of an actuator of the actuating device to the surface of the optical element from FIGS. 2A and 2B, FIGS. 4A-4F show schematic illustrations of a plurality of possibilities for generating a compressive stress in the material of an optical element of an optical manipulator with the use of different coefficients of thermal expansion.

In the example illustrated in FIG. 3A, the foot F is adhesively bonded to the surface O1 of the optical element OE, i.e. an adhesive layer 10 is introduced between the contact area K and the surface O1, said adhesive layer in the example shown being applied to a protective layer 11 for protecting the adhesive layer 10 from stray radiation in the UV wavelength range from the optical element OE. The projective layer 11 consists of a material that is non-transmissive to radiation in the UV wavelength range.

If the force visualized by an arrow in FIG. 3A acts on the foot F, a tensile stress is transmitted from the foot F to the material of the optical element OE, which tensile stress assumes a maximum value in an action region IA, which in the example shown partly overlaps that region at the surface O1 of the optical element OE which is covered by the contact area K or by the adhesive layer 10. The action region IA is formed on the opposite side of the foot F relative to the effective direction of the lateral force. Since the effective direction of the force of the actuator AK engaging at the foot F can typically be varied practically arbitrary in the x-y-plane, the action region IA, in which a maximum tensile stress occurs in the optical element OE, typically extends in a ring-shaped manner around the contact area K.

Figure 3B:
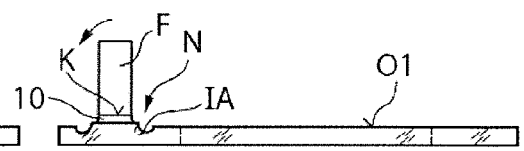

In order to divert the tensile stress away from the adhesive layer 10, in the case of the optical element OE shown in FIG. 3B, the foot F or the contact area K thereof is surrounded by an annular groove N milled into the surface O1 of the optical element OE. In this case, the action region IA is formed within the groove N, i.e. the maximum tensile stresses during the deflection of the foot F serving as a lever occur within the groove N.

Figure 3C:
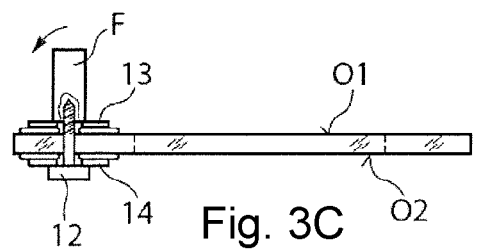

FIG. 3C shows a further possibility for fixing the foot F to the surface O1 of the optical element OE, in which a bore is introduced in the optical element OE, through which bore a screw 12 is inserted, said screw being screwed to an internal thread formed in the foot F. A respective shim 13, 14 is introduced between the foot F and the first surface O1 of the optical element OE and between the head of the screw 12 and the second surface O2 of the optical element OE.

Figure 3D:
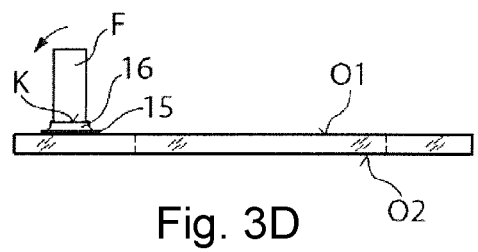

In the case of the foot F illustrated in FIG. 3D, a metallization layer 15 is applied to the surface O1 of the optical element OE in order to solder or weld the foot F thereon with a solder 16. As an alternative to the examples shown in FIGS. 3A-3D, the actuators AK or the feet F thereof can also engage on both mutually opposite surfaces O1, O2 of the optical element OE.

In all cases shown in FIGS. 3A-3D, a connection resistant to shearing is produced between the foot F and the optical element OE in order to enable the bending of the optical element OE. During the bending of the optical element OE, tensile stresses are introduced in the action regions IA in proximity to the contact areas K of the feet F, which tensile stresses can be more than 1 MPa, if appropriate more than 10 MPa or higher. The tensile strength of the fused silica material of the optical element OE is approximately 50 MPa to 60 MPa for static loads.

The central control device CU of the projection exposure apparatus WSC acts continuously on the actuating device DR of the optical manipulator MAN during the exposure operation of the projection exposure apparatus WSC in order to correct wavelength aberrations in real time, such that the tensile and compressive loading of the optical element OE varies frequently and greatly. Therefore, the formation of cracks or fractures in the optical element OE can occur before the planned lifetime thereof is reached.

Since the fused silica material of the optical element OE is largely insensitive to compressive stresses, in order to lengthen the lifetime of the optical element OE it is proposed to introduce a prestress in the form of a compressive stress into the optical element OE, which counteracts the tensile stress brought about by the pivoting movement of the feet F of the actuators AK, such that the material of the optical element OE is always subjected to compressive loading or at least the tensile stress in the material of the optical element OE can be reduced by the counteracting compressive stress. A compressive stress suitable for the purpose should be here more than 1 MPa, preferably more than 100 MPa, in particular more than 500 MPa.

In order to generate a compressive stress of this order of magnitude in the optical element OE, an external compressive stress can be generated by a tensioning device MO enclosing the plate-shaped optical element OE, as illustrated by way of example in FIG. 2B. The tensioning device MO is embodied as a circumferential metallic mount shrink-fitted onto the outer edges of the optical element OE. The tensioning device MO substantially introduces compressive stresses along the two principal axes (x and y) of the optical element OE. The mechanical tensioning device MO can typically introduce compressive stresses of the order of magnitude of a plurality of MPa into the optical element OE, such that tensile stresses of the same order of magnitude that are introduced by the actuators AK can be compensated for.

In the case of the optical elements OE shown in FIGS. 4A-4F, in order to generate the compressive stress a respective tensile stress is exerted on at least one surface O1, O2 of the optical element OE by virtue of at least one tensile layer being applied to the optical element OE, such that the underlying glass material of the optical element OE is subjected to a compressive stress. For generating the tensile stress at the surface O1, O2 of the optical element OE, it is possible to use a material having a greater coefficient of thermal expansion CTE2 than the material of the optical element OE (having a coefficient of thermal expansion CTE1), that is to say that CTE2>CTE1 holds true.

Figure 4A:
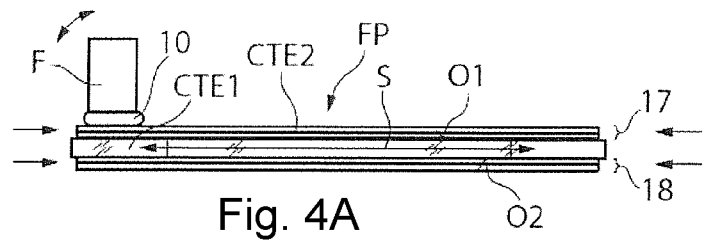

In the case of the example shown in FIG. 4A, the tensile stress is generated by a coating 17, 18 applied to a respective surface O1, O2 of the optical element OE. In order to apply the coating 17, 18, the optical element OE is typically heated and the coating material is vapour-deposited onto the respective surface O1, O2 or applied to the optical element OE by sputtering, if appropriate in a manner assisted by ion beams. After the cooling of the coating 17, 18 and of the optical element OE serving as a substrate, the coating 17, 18 contracts to a greater extent than the material of the optical element OE on account of the higher coefficient of thermal expansion CTE2, such that the coating 17, 18 generates a tensile stress (indicated by arrows in FIG. 4a) which results in an opposite compressive stress S in the material of the optical element OE. If the coating temperature is in a range of approximately 300° C. to 500° C., the coating process should be carried out before the possibly required loading of the optical element OE with hydrogen.

As layer materials for the coating 17, 18, which consists of two layers (per side) by way of example in FIG. 4a but which can also consist of more layers or just of one layer, in the case of the whole-area application illustrated in FIG. 4a including within the optically used region FP, materials which are transparent to the used radiation in the UV wavelength range should be used, for example metal fluorides, such as $MgF_2$ and $LaF_3$, which are transparent to radiation at 193 nm and can be used to generate layer stresses of up to 400 MPa, which is more than sufficient in view of the changing loads of the tensile stress of a few MPa. Metal oxides such as $Al_2O_3$ and $HfO_2$ are also sufficiently transparent at 248 nm and, if appropriate, also at 193 nm.

In FIG. 4A, a coating 17 is applied to the top side O1 of the optical element OE and a coating 18 is also applied to the underside O2 of the optical element OE, even though the actuators AK or the feet F engage only on the top side O1 of the optical element OE. The coating 18 on the underside O2 avoids deformation of the plate under the tensile stress of a coating 17 applied on one side. However, if appropriate, a coating 17 applied only on the surface O1 of a respectively engaging lever or foot F is sufficient. In the case of a strained coating 17, 18 of the transmissive optical element OE including in the optically used region FP, as shown FIG. 4A, it is advantageous to coat the plate-shaped optical element OE from both sides homogeneously with a coating 17, 18 strained to an identical magnitude in each case, in order that a light ray upon passing through obliquely perceives in each case the same stress components transversely with respect to their principal light direction.

Figure 4B:
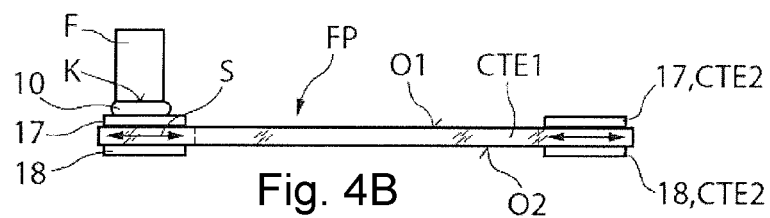

FIG. 4B shows a variant of a coating 17, 18 that is applied over the whole area only outside the optically used region FP of the optical element OE, i.e. in the frame-shaped region shown in FIG. 2B. The coating 17, 18 thus surrounds the optically used region FP of the optical element OE and can be produced for example by the optical element OE being covered within the optically used region FP during the coating. As a result of the ring-shaped application of the coating 17, 18 outside the optically used region FP, it is also possible to use coating materials which are non-transparent to the used radiation of the projection exposure apparatus WSC, for example metallic or ceramic materials. Moreover, the optically used region FP can be kept free of stresses resulting from the coating 17, 18 which might lead to birefringence.

Figure 4C:
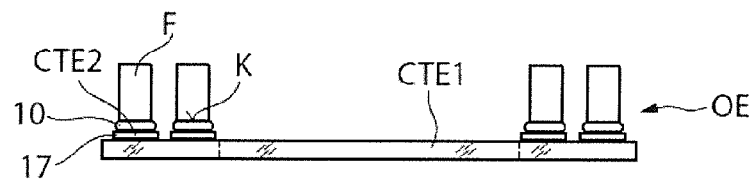
Figure 4D:
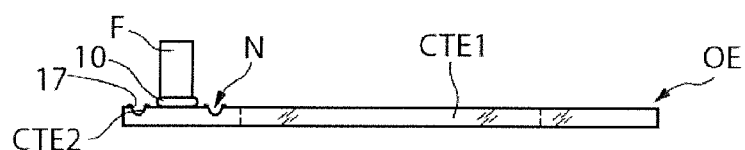

The loading on the optically used region FP can be relieved even further if the coating 17 is applied in an island-shaped fashion in the vicinity of the contact area K of each foot F, as is illustrated in FIG. 4C. If a respective foot F or a contact area is surrounded by a ring-shapedly circumferential groove N, it may be sufficient to apply the coating 17 only within the groove N and, if appropriate, in a planar surface region adjoining the groove N, as is shown in FIG. 4D.

Figure 4E:
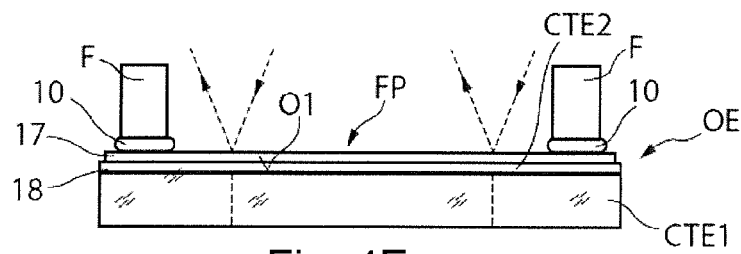

Applying a coating on one side is possible particularly in the case of a reflective optical element OE in the form of a mirror, as is illustrated in FIG. 4E. The reflective optical element OE can be for example the concave mirror CM of the projection lens PO shown in FIG. 1. As can be discerned in FIG. 4E, the optical element OE in this case has a substrate, which can be formed for example from fused silica or from titanium-doped fused silica. The plate-shaped optical element OE has a metallic coating 18, to which a reflection-amplifying coating 17 is applied, which can comprise for example one or a plurality of metal fluorides or metal oxides. In the example shown, the metallic coating 18 has a greater coefficient of thermal expansion CTE2 than the material of the optical element OE, such that the metallic coating 18 acts as a tensile layer.

Figure 4F:
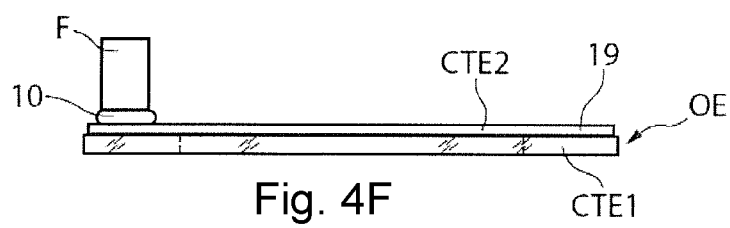

A further possibility for generating a compressive stress using a layer 19 or a body having a higher coefficient of thermal expansion CTE2 than that of the material of the optical element OE is illustrated in FIG. 4F. The layer 19 or a plate-shaped body composed of a material different from that of the optical element OE, for example composed of a glass or a glass ceramic, is applied, e.g. bonded or fused, at elevated temperature onto the ground, lapped or polished surface O1 of the optical element OE. The body can be a silicate glass which has a significantly lower melting point than fused silica and already enters into a mechanically fixed connection below the glass transition temperature of fused silica (high-temperature bonding).

With specific alkaline solutions, a mechanically fixed connection can already be produced at temperatures of a few 100° C. (low-temperature bonding) or with glass pastes ("frit bonding"). The layer 19 having the higher coefficient of thermal expansion can also be produced, if appropriate, by a glass powder being fused locally by irradiation using a laser.

In all cases presented above, the layer 19 when producing the connection is considerably thicker than in the case of a traditional coating. It is therefore generally necessary for the e.g. fused-on or bonded-on layer 19 to be thinned by grinding or polishing after the production of the connection. If a ring groove N is formed on the optical element OE around the contact area K of the actuator AK, then for example a layer of a different glass can be fused into the material of the optical element OE serving as a substrate and can then be removed by milling processing in order once again to produce a ring groove N.

Figure 5A:
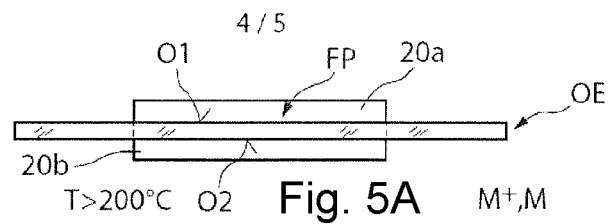
FIGS. 5A-5D show schematic illustrations of the generation of a compressive stress in an optical element through ion implantation and by indiffusion of a gas.

A further possibility for generating a compressive stress of more than 1 MPa up to 1000 MPa consists in incorporating ions, in particular metal ions, into the glass matrix of the material of the optical element OE. Not only tetravalent metals such as Ti, for example, but also metals having a different valency such as Na and Cu, for example, can diffuse into the glass at sufficiently high temperatures and be incorporated there. FIG. 5A shows such an implantation process, which involves providing metal ions $M^+$ or metal vapour M in the gas phase, which indiffuses into the material of the optical element OE at sufficiently high temperatures of e.g. more than 200° C., specifically in a near-surface volume region having a thickness d of typically between approximately 1 μm and 1 mm. High temperatures and a low pressure are used for the implantation of most metals, except when the latter have a high vapour pressure, as is the case for mercury, for example.

Most metal ions or the metal atoms covalently bonded in the glass matrix result in high absorption in the UV wavelength range in fused silica, such that in the case of the optical element OE illustrated in FIG. 5A it is necessary to protect the optically used region FP against the indiffusion of metal ions. In FIG. 5A, this is achieved by a respective plate 20a, 20b being placed onto a surface O1, O2 of the optical element OE, these plates being formed from the same material as the optical element OE or from a different material, in which the diffusion proceeds more slowly than in the material of the optical element OE. The plates 20a, 20b are dimensioned such that they cover the optically used region FP over the whole area.

Figure 5B:
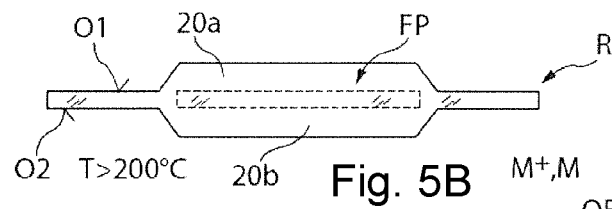

A further possibility for protecting the optically used region against the indiffusion of metal ions is illustrated in FIG. 5B, which illustrates a blank R for producing the optical element OE, said blank having protective beads 20a, 20b surrounding the optically used region FP in order to prevent the metal ions $M^+$ from being able to penetrate into the optically used region. After loading with metal ions, the protective beads 20a, 20b are removed in order to produce the plate-shaped optical element OE.

If the doping treatment is performed at more than 300° C. to 500° C., it is advantageous if the loading of the material of the optical element OE with hydrogen is carried out only after the doping. If ions are implanted which do not result in an appreciable increase in absorption in fused silica, for example aluminium ions, the masking can generally be dispensed with. Measures for protecting the optically used region FP are generally not required in the case of an optical element in the form of a mirror, for example composed of fused silica, titanium-doped fused silica, glass ceramic or ceramic.

As an alternative to the indiffusion of metal ions from the gas phase into the material of the optical element OE as shown in FIGS. 5A, 5B, it is also possible to incorporate the metal ions into the optical element OE in the ion exchange method. In this case, the indiffusion is carried out by the optical element OE being dipped into the hot melt of a salt having ions that are larger than the ions present in the glass material. The smaller ions present in the glass material are exchanged for the larger ions of the salt melt. The larger ions generate a compressive stress in a near-surface volume region of the optical element OE, a few 10 μm already sufficing to increase the tensile strength of the glass by more than one order of magnitude.

Figure 5C:
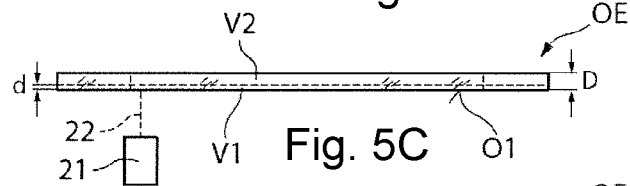

FIG. 5C shows a further possibility for ion implantation into the material of the optical element OE, which involves using an ion source 21 for generating an ion beam 22 that is radiated onto the surface O1 of the optical element OE in order to implant ions in a near-surface volume region V1. The ion implantation can be carried out at room temperature of a slightly higher temperature. The penetration depth or the thickness d of the near-surface volume region V1 and the concentration profile can be controlled by the selection of the ions and the acceleration voltage. Moreover, the lateral doping profile can be controlled by the use of the narrowerly delimited ion beam 22, such that effective masking of the optically used region FP can be carried out in a significantly simplified manner. The doping shown in FIG. 5C can generally be carried out with any type of particle beam and also with non-metals.

Figure 5D:
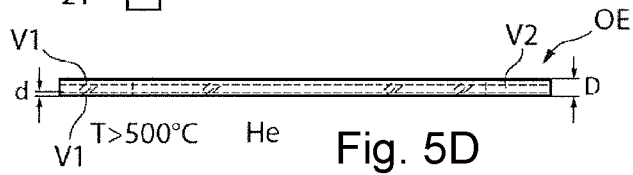

A further possibility for generating the compressive stress in the optical element OE consists in letting a gas indiffuse into the optical element OE. Gases are molecularly dissolved in fused silica, i.e. the gas atoms or molecules are incorporated at "interstitial sites". A compressive stress in the fused silica material can be produced in particular by the latter being loaded with a noble gas, e.g. with helium (cf. FIG. 5D) and/or with nitrogen. The gas is typically introduced into the optical element OE at high loading temperature T of e.g. more than 500° C. and generally under increased pressure relative to atmospheric pressure. The above-described gases diffuse more slowly than molecular hydrogen at room temperature, such that the outdiffusion over the lifetime of the optical element OE is lower than would be the case for the incorporation of molecular hydrogen into the optical element OE. Moreover, with nitrogen and/or noble gases it is possible to incorporate high concentrations of more than e.g. $1 \times 10^{16}$ molecules/$cm^3$, more than $5 \times 10^{16}$ molecules/$cm^3$ or more than $1 \times 10^{18}$ molecules/$cm^3$ in a near-surface volume region V1, without the glass being damaged. A high concentration of the indiffused gases brings about a high compressive stress in the near-surface volume region V1. A lateral control of the concentration and of the strain, for example for generating the compressive stress only in the action regions of the actuators AK, can be carried out by masking or precontouring of the optical element OE or of the blank R from which the optical element OE is produced (in this respect, cf. FIGS. 5A, 5B). Precontouring is generally more advantageous at elevated pressures and temperatures.

In order to generate a compressive stress in the optical element OE, it is also possible to produce in a near-surface volume region V1 a density D1 that deviates from the density D2 of the rest of the volume V2 of the optical element OE, or to produce a density gradient in the optical element OE.

The density D1 in the near-surface volume region V1 can be less than the density D2 in the rest of the volume V2 of the optical element OE. This is the case, for example, if the density gradient is produced by heat treatment, i.e. if the glass is heated to a temperature below the transition temperature $T_G$ and just above the lower relaxation temperature and is kept at this temperature for a number of days or weeks. The glass is then quenched by gas being blown thereon, or by immersion in a liquid, e.g. in ice water or liquid nitrogen. Since the surfaces of the glass or the near-surface volume region V1 cools more rapidly than the rest of the volume V2 of the optical element OE, the glass has a lower density after cooling in the near-surface volume region V1, would therefore like to occupy a larger volume and therefore places the surfaces O1, O2 of the optical element OE under an compressive stress.

Figure 6A:
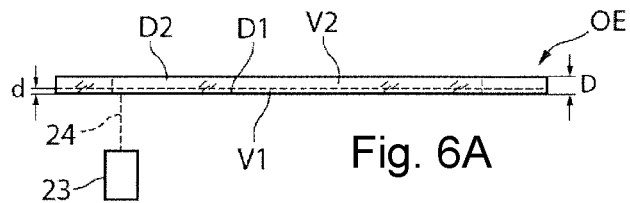
FIGS. 6A-6C show schematic illustrations of the generation of a compressive stress in a plate-shaped optical element by compaction and rarefaction.

FIG. 6A shows a further possibility for altering the density D1 in the near-surface volume region V1 relative to the density D2 in the rest of the volume V2, specifically by the glass material being compacted in the near-surface volume region V1. For this purpose, the optical element OE is bombarded with an x-ray beam 24 generated by a radiation source 25, in order to produce a permanent compaction of the glass material of typically more than 1% by volume, if appropriate of more than 2% by volume or of more than 3% by volume. The penetration depth or the thickness d of the compacted volume region V1 is extremely small and is less than approximately 10 nm, for example, such that said volume region acts as a tensile layer and brings about a compression, i.e. a compressive stress, of the underlying (non-near-surface) volume region V2. 10 nm is the typical penetration depth of soft x-ray radiation into fused silica or into titanium-doped fused silica. As an alternative to the use of an x-ray beam 24, other high-energy radiation can also be used for compaction purposes, shorter wavelengths penetrating less deeply into the fused silica material. What is essential is that in proximity to the surface O1 a strain occurs between the near-surface volume region V1 and the rest of the volume V2 of the optical element OE which results in the desired compressive stress.

Figure 6B:
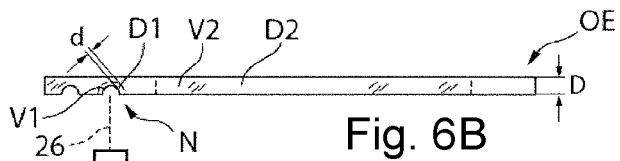

The densification or compaction of the material of the optical element OE is advantageous in particular in island-shaped surface regions around the contact areas K of the actuators AK. This method has also proved to be advantageous for hardening the surface of a groove N surrounding the contact area K in a ring-shaped manner. FIG. 6B shows such a compaction in the region of the ring-shaped groove N using an electron beam 26 generated by electron gun 25. By using an electron beam 26, too, a near-surface volume region V1 having a very small thickness d of less than e.g. 10 nm can be compacted so as to act as a tensile layer and to exert a compressive stress on the underlying rest of the volume V2 of the optical element OE.

Figure 6C:
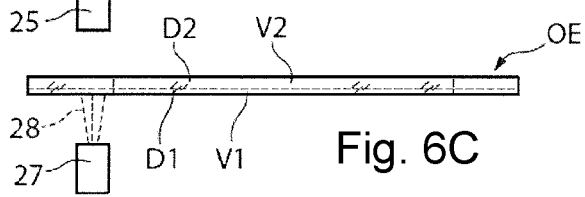

A further possibility for generating a compressive stress consists in subjecting the optical element OE to a pre-irradiation with UV radiation 28 generated by a laser source 27, cf. FIG. 6C. In this case, the fused silica material of the optical element OE at least in a near-surface volume region V1 has an OH content of more than 700 ppm (by weight) and a hydrogen content of more than $5 \times 10^{17}$ molecules/cm$^3$. Such fused silicas tend towards swelling, so-called rarefaction, during the irradiation with UV laser light having a low energy density.

The reduction of the density D1 in the near-surface volume region V1 relative to the density D2 in the rest of the volume V2 of the optical element OE results in a strain that generates the desired compressive stress. In the example shown, hardening can be carried out by pre-irradiation at least in the action regions, i.e. in the regions of highest stress, and post-hardening is carried out by using stray light at the used wavelength in the UV wavelength range during the operation of the optical element OE. Titanium-doped fused silica also has a composition suitable for the rarefaction, provided that it was produced in direct deposition, such as ULE® from Corning, for instance, with the result that e.g. mirrors composed of this material can likewise be hardened in the manner described above.

Figure 7A:
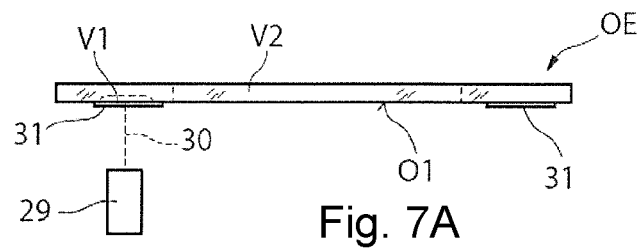
FIGS. 7A-7B show schematic illustrations of the generation of a compressive stress in an optical element by laser heat treatment and by laser polishing.
Figure 7B:
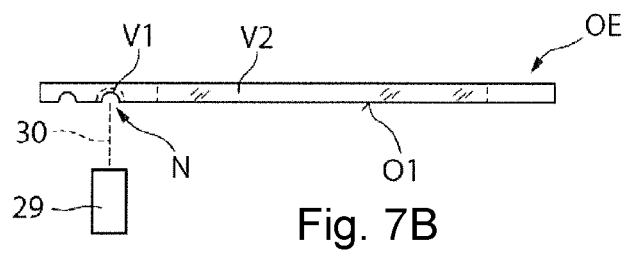

FIGS. 7A, 7B show a further possibility for generating a compressive stress in the optical element OE by laser annealing or laser polishing. In the example shown in FIG. 7A, use is made of a laser beam 30 generated by a laser source 29 in the example shown, said laser source generating radiation at a wavelength of approximately 1 µm. Since laser radiation 30 at this wavelength is absorbed only weakly by the fused silica of the optical element OE, an absorbent layer 31 is applied (temporarily) to the optical element OE. After the termination of the laser heat treatment, the absorbent layer 31 is removed again from the optical element OE. As is shown in FIG. 7A, preferably an island-shaped partial region of the surface O1 of the optical element OE is subjected to laser annealing with the laser beam 30, which partial region corresponds approximately to the size of the contact area K of the foot F of the actuator AK. As an alternative to applying an absorption layer 31, for laser annealing it is also possible to use laser radiation 30 having a wavelength that is readily absorbed by the fused silica material of the optical element OE, for example laser radiation at wavelengths of more than 3500 nm or, in the case of short (ps or fs) light pulses, laser radiation in the near UV wavelength range.

The cooling of the near-surface volume region V1 heated by the laser radiation 30 takes place within a few nanoseconds by emission from the surface O1, that is to say that, in the case of the pulsed light source LS having a maximum pulse duration of a few ns and sufficient pauses between the pulses, the cooling takes place between the pulses. Since the fused silica material is hardened locally only in regions which are heated to more than 1000° C., the hardening arises despite macroscopic heating of the irradiation region given a suitable pulse duration only within the thin near-surface volume region V1 having a thickness d of a few µm, i.e. over a thickness d which turns out to be significantly smaller in comparison with the total thickness D of the optical element OE of typically approximately 2 to 3 mm. If no absorption layer 31 is present, the penetration depth of the thickness d can be controlled not only by the pulse duration but also by the choice of wavelength.

FIG. 7B shows a laser beam 30 in which the laser parameters are set such that the surface O1 of the fused silica material is heated to more than 1000° C., i.e. to a temperature above the transition temperature $T_G$, and thus melts locally. As a result, it is possible to anneal depth damage, grounding or polishing defects, etc., which might reduce the strength of the surface O1 owing to crack growth or notch stresses. Since the near-surface volume region V1 is very thin, the result, as in the methods described further above, is strain and thus the formation of a compressive stress in or between the near-surface volume region V1 and the rest of the volume V2 of the optical element OE. Laser polishing is suitable particularly for hardening the ring-shaped groove N, the depth damage of which can be reduced by the laser polishing. Provided that the depth damage can be cured or the tendency towards crack growth within the groove N can be reduced sufficiently, the laser polishing of the ring groove N makes it possible, if appropriate, to dispense with the introduction of a compressive stress of more than 1 MPa into the optical element OE.

As an alternative or in addition to the procedure described further above in which a compressive stress is introduced into the optical element OE, the lifetime of the optical element OE can also be increased by reduction of the tensile stresses into the optical element OE by the actuators AK. For this purpose, the foot F, with which a respective actuator AK engages on the optical element OE, or the connection between the foot F and the optical element OE can be designed in a suitable manner.

Figure 8A:
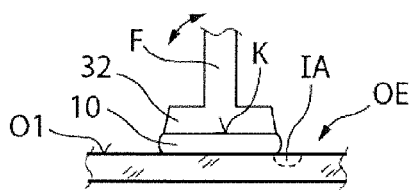
FIGS. 8A-8D show schematic illustrations of a foot of an actuator without (FIG. 8a) and with a profile having the continuously decreasing thickness (FIGS. 8B-8D).

FIG. 8A shows a conventional foot F, which has at its end facing the optical element OE a portion 32 which is substantially rectangular in longitudinal section and which widens discontinuously relative to the rest of the foot F. The foot F is typically formed from aluminium, steel or a high-strength ceramic and, by way of an adhesive layer 10, forms a sufficiently shearing-resistant connection to the fused silica material of the OE, i.e. the foot F together with the fused silica material forms a composite material having increased strength since most of the materials mentioned above have a higher fatigue strength than the fused silica material of the optical element OE. However, the region of increased strength is restricted to that surface region of the optical element OE which is covered by the contact area K. As is illustrated in FIG. 8A, the action region IA in which the maximum tensile stresses occur is formed outside the partial region of the surface O1 covered by the foot F, in which the strength is not increased.

Figure 8C:
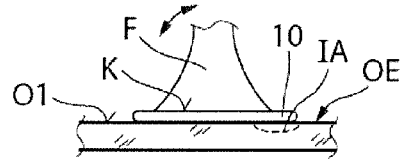
Figure 8B:
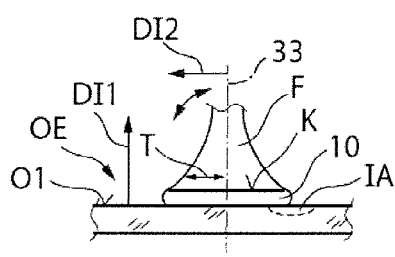

In the case of the foot F shown in FIG. 8B, the thickness T of the foot F increases continuously with increasing distance DI1 from the surface O1 of the optical element OE or from the contact area K, i.e. the foot F embodied rotationally symmetrically with respect to a centre axis 33 has in the vicinity of the contact area K a contoured profile which decreases continuously, in particular exponentially, in dependence of the thickness T. In the case of the foot F having the contoured profile, the strength of the foot F at the contact area K decreases continuously towards the outside in a radial direction proceeding from the centre axis 33, such that the foot F, in the outer regions that are furthest away from the centre axis 33, can increasingly deform upon the actuation of the foot F in the manner of a lever. As can be discerned in FIG. 8B, in this case the action region IA having the maximum tensile stresses is distributed over a larger region, such that the maximum stresses decrease in terms of their amplitude. In addition, the action region IA partly lies in that region of the surface O1 which is covered by the contact area K of the foot F.

As an alternative or in addition to the choice of a foot F having a suitable, continuously varying profile, the material of the foot F, at least in the vicinity of the contact area K, can also have a mechanical strength that decreases continuously with increasing distance DI2 from the centre axis 33 of the foot F (cf. FIG. 8B). The variation of the mechanical strength of the foot F can be produced for example by using a composition made of different alloying layers or by using a doping gradient.

FIG. 8C shows the foot F from FIG. 8B, in the case of which an adhesive layer 10 is introduced between the contact area K and the surface O1, which adhesive layer is fibre-reinforced, unlike the adhesive layer 10 shown in FIG. 8b. The fibre-reinforced adhesive layer 10 extends on the surface O1 beyond that partial region of the surface O1 which is covered by the foot F, in order to spatially smear the maximum tensile stresses. As can likewise be discerned in FIG. 8C, the action region IA in this case is arranged substantially below the fibre-reinforced adhesive layer 10.

Figure 8D:
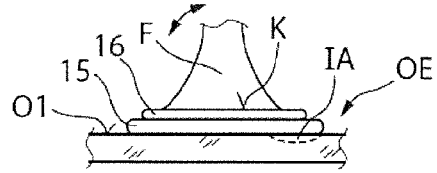

Instead of an adhesive, the foot F can also be applied to the surface O1 of the optical element OE in a different way, for example by utilyzing a metallization layer 15, onto which the foot F can be soldered with a solder 16, or possibly welded, as is illustrated in FIG. 8D. As in the case of the fibre-reinforced adhesive layer 10 from FIG. 8C, in the case of the fixing illustrated in FIG. 8D, too, a certain smearing of the stresses or of the action region IA can be achieved by choosing the diameter and the thickness profile of the solder 16 and/or of the metallization layer 15. In the case of the feet F shown in FIGS. 8B-8D, what can be achieved in this way is that the maximum tensile stresses in the action regions IA upon the actuation of the optical element OE are reduced to less than 1 MPa.

The contoured foot F illustrated in FIGS. 8B-8D can be heated to an elevated temperature for the purpose of curing the adhesive layer 10 or for soldering or welding purposes. After cooling, the foot F typically shrinks to a greater extent than the surface O1 of the optical element OE, such that the strength of the glass of the optical element OE is increased further by the compressive stress introduced in this way. In particular, in this case it is possible to introduce into the glass material of the optical element OE a compressive stress which is more than 1 MPa in the non-actuated state of the optical element OE. As a result of the simultaneous reduction of the maximum tensile stress to less than 1 MPa, the optical element OE is always subjected to compressive loading even during actuation, and so the lifetime of the optical element OE can be significantly increased.

To summarize, what can be achieved in the manner described further above is that the optical element OE of the optical manipulator MAN has an increased fracture resistance during the typically continuous action of the actuators AK for manipulating the wavefront during the exposure operation of the projection exposure apparatus WSC. As a result, the lifetime of the optical element OE in the projection lens PO is lengthened to at least one billion exposure processes. If appropriate, the optical element OE for wavefront manipulation can also be embodied as a lens and/or can act on a further optical element, as is described for example in US 2008/0239503 A1, which is cited in the introduction and is incorporated by reference into this application in its entirety.

What is claimed is:

1. An optical manipulator, comprising:
an optical element having a surface form that consists of an optically used region configured and arranged to be illuminated by light from an object field of a projection objective and a region outside the optically user region;
an actuating device reversibly changing the surface form of the optical element; and
a tensioning device enclosing the optical element in the region outside the optically used region, wherein the tensioning device generates a compressive stress with a mechanical prestress of the optical element,
wherein the actuating device comprises a plurality of actuators configured to mechanically act on the optical element at a plurality of contact areas of the optical element, wherein the plurality of actuators connect to the optical element at the plurality of contact areas that are in the region outside the optically used region, and wherein the optical element, at action regions that partially overlap with the contact areas and are in the region outside the optically used region, is prestressed with the compressive stress of more than 1 MPa that counteracts a tensile stress introduced into the optical element by the plurality of actuators acting on the optical element.

2. The optical manipulator according to claim 1, wherein the optical element is plate-shaped.

3. The optical manipulator according to claim 1, wherein the compressive stress is formed at at least one surface of the optical element, in a near-surface volume region or in a non-near-surface volume region of the optical element.

4. The optical manipulator according to claim 1, wherein the compressive stress is formed both within and outside the optically used region of the optical element.

5. The optical manipulator according to claim 1, wherein the compressive stress is formed only outside the optically used region of the optical element.

6. The optical manipulator according to claim 1, wherein the compressive stress is limited to the action regions.

7. The optical manipulator according to claim 1, further comprising at least one coating which is vapour-deposited onto a surface of the optical element, which generates the compressive stress and which has a coefficient of thermal expansion that is greater than a coefficient of thermal expansion of the optical element.

8. The optical manipulator according to claim 1, further comprising a layer which is connected to a surface of the optical element, which generates the compressive stress and which has a coefficient of thermal expansion that is greater than a coefficient of thermal expansion of the optical element.

9. The optical manipulator according to claim 1, wherein ions or metal atoms are incorporated into the optical element, which generates the compressive stress at least in a near-surface volume region of the optical element.

10. The optical manipulator according to claim 9, wherein the ions or the metal atoms are incorporated into the near-surface volume region by:
  (a) ion exchange or by a gas-phase indiffusion, or
  (b) ion-beam implantation.

11. The optical manipulator according to claim 1, wherein the optical element is composed of fused silica.

12. The optical manipulator according to claim 1, wherein the optical element is loaded with at least one gas, which generates the compressive stress.

13. The optical manipulator according to claim 12, wherein the content of the gas at least in a near-surface volume region of the optical element is more than $1 \times 10^{16}$ molecules/cm$^3$.

14. The optical manipulator according to claim 1, wherein a material of the optical element, which generates the compressive stress in a near-surface volume region of the optical element has a density deviating from a remaining volume of the optical element and/or has a density gradient.

15. The optical manipulator according to claim 14, wherein the material of the optical element in the near-surface volume region has a density at least 1% higher than in the remaining volume of the optical element.

16. The optical manipulator according to claim 14, wherein the material of the optical element at least in the near-surface volume region has an OH content of more than 700 ppm and a hydrogen content of more than $5 \times 10^{17}$ molecules/cm$^3$.

17. The optical manipulator according to claim 1, wherein the compressive stress is generated by annealing of the optical element or by fusion of the optical element in a near-surface volume region of the optical element.

18. The optical manipulator according to claim 1, wherein at least one contact area connecting at least one actuator to a surface of the optical element is surrounded by a circumferential groove formed at the surface of the optical element.

19. The optical manipulator according to claim 1, wherein at least one actuator of the actuating device has an actuatable foot, at which a contact area connecting the actuator to a surface of the optical element is formed.

20. The optical manipulator according to claim 1, wherein the action regions are prestressed with the compressive stress of more than 100 MPa prior to having the actuators mechanically act on the optical element.

21. The optical manipulator according to claim 1, wherein the compressive stress is greater than the tensile stress introduced by the plurality of actuators.

22. The optical manipulator according to claim 1, wherein the compressive stress and the tensile stress act perpendicularly to thickness direction of the optical element or substantially parallel to a surface of the optical element.

23. The optical manipulator according to claim 1, wherein the optical element is prestressed with the compressive stress of more than 1 MPa that is not caused by the plurality of actuators mechanically acting on the optical element.

24. The optical manipulator according to claim 1, wherein the tensioning device is in direct contact with the optical element.

25. The optical manipulator according to claim 1, wherein the tensioning device continuously encompasses the optical element and clamps outer edges of the optical element.

26. The optical manipulator according to claim 1, wherein the tensioning device is composed of glass and/or ceramic.

27. The optical manipulator according to claim 1, wherein the tensioning device is a frame that is embodied in a segmented fashion and introduces the mechanical compressive stress along two principal axes of the optical element.

28. The optical manipulator according to claim 1, wherein the tensioning device is composed of same material as the optical element.

29. The optical manipulator according to claim 1, wherein the action regions are embodied in a circular or ring-shaped fashion around or below the contact areas.

30. The optical manipulator according to claim 1, wherein the action regions are formed in an annular groove that surrounds the contact areas.

* * * * *

UNITED STATES PATENT AND TRADEMARK OFFICE
CERTIFICATE OF CORRECTION

PATENT NO. : 10,976,667 B2
APPLICATION NO. : 15/395460
DATED : April 13, 2021
INVENTOR(S) : Eric Eva It is certified that error appears in the above-identified patent and that said Letters Patent is hereby corrected as shown below:

In the Specification

In Column 7, Line 46, delete "stochiometry" and insert -- stoichiometry --, therefor.

In Column 9, Line 50, delete "narrowerly" and insert -- narrowly --, therefor.

In Column 10, Line 60, delete "1×1016" and insert -- $1 \times 10^{16}$ --, therefor.

In Column 20, Line 24, delete "A*=|B|A" and insert -- A*=|β|A --, therefor.

In Column 20, Line 25, delete "B*=|B|B." and insert -- B*=|β|B. --, therefor.

In Column 26, Line 28, delete "narrowerly" and insert -- narrowly --, therefor.

In Column 30, Line 9, delete "utilyzing" and insert -- utilizing --, therefor.

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*